United States Patent

Omachi

[11] Patent Number: 5,835,437
[45] Date of Patent: Nov. 10, 1998

[54] SEMICONDUCTOR MEMORY DEVICE HAVING MEMORY CELL ARRAY DIVIDED INTO A PLURALITY OF MEMORY BLOCKS

[75] Inventor: Ryuji Omachi, Hyogo, Japan

[73] Assignees: Mitsubishi Denki Kabushiki Kaisha; Mitsubishi Electric Engineering Co., Ltd., both of Tokyo, Japan

[21] Appl. No.: 900,514

[22] Filed: Jul. 25, 1997

[30] Foreign Application Priority Data

Aug. 30, 1996 [JP] Japan .................................. 8-230544

[51] Int. Cl.⁶ ........................................ G11C 7/00
[52] U.S. Cl. ........................ 365/230.03; 365/189.05; 365/193
[58] Field of Search .............. 365/230.03, 193, 365/189.05

[56] References Cited

U.S. PATENT DOCUMENTS

| | | | |
|---|---|---|---|
| 5,621,695 | 4/1997 | Tran .................................. | 365/230.03 |
| 5,627,791 | 5/1997 | Wright et al. .................. | 365/230.03 X |
| 5,629,902 | 5/1997 | Hoshi et al. .................... | 365/230.03 X |
| 5,638,335 | 6/1997 | Akiyama et al. .................. | 365/230.03 |
| 5,691,955 | 11/1997 | Yamauchi ....................... | 365/230.03 X |

FOREIGN PATENT DOCUMENTS 60-217592 10/1985 Japan .
5-6657 1/1993 Japan .

*Primary Examiner*—Do Hyun Yoo
*Attorney, Agent, or Firm*—McDermott, Will & Emery

[57] ABSTRACT

An internal control signal generating circuit produces first and second control signals according to input signals received from a /RAS pin, a first /CAS pin, and a second /CAS pin. Upon readout operation, readout data of first or second memory block is output from a first external terminal while readout data of third or fourth memory block is output from a second external terminal according to the first and second control signals. Meanwhile, upon write operation, input data from the first external terminal becomes write data of first or second memory block while input data from the second external terminal becomes write data of third or fourth memory block according to first and second control signals. Accordingly, it is possible to suppress increase in the chip area caused from increase in number of memory blocks.

7 Claims, 17 Drawing Sheets

FIG.3
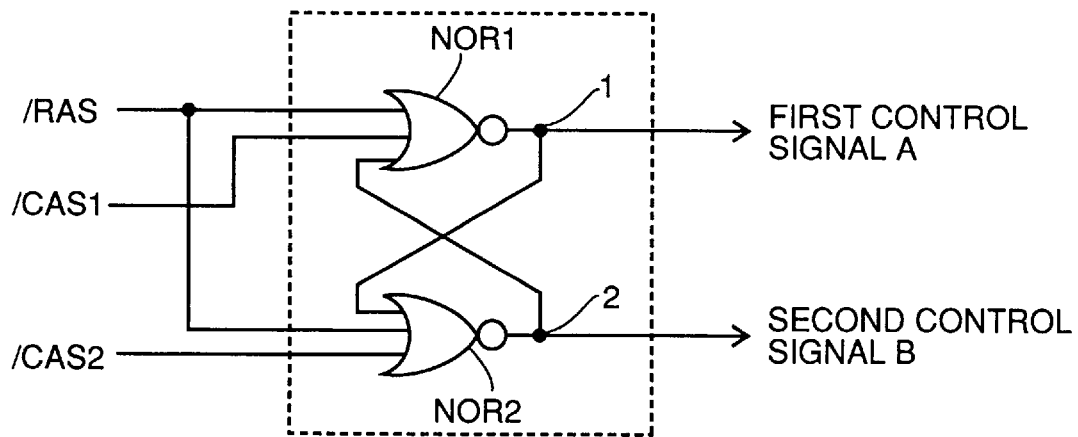
FIG.4A  /RAS 
FIG.4B  /CAS1 
FIG.4C  /CAS2 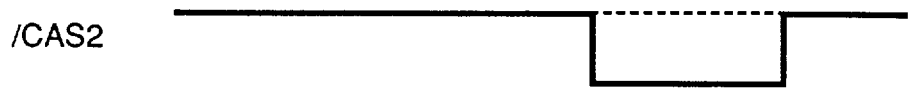
FIG.4D  A 
FIG.4E  B 
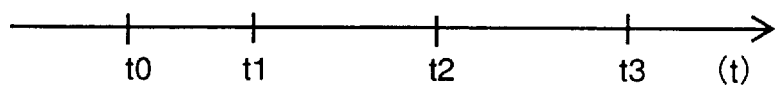

FIG.11
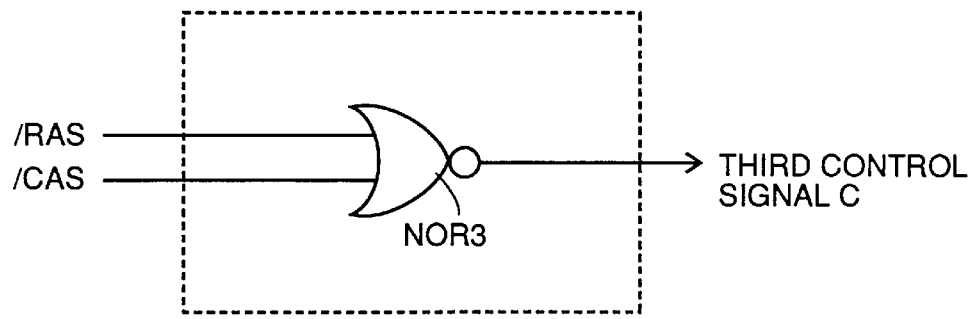
FIG.12A /RAS
FIG.12B /CAS
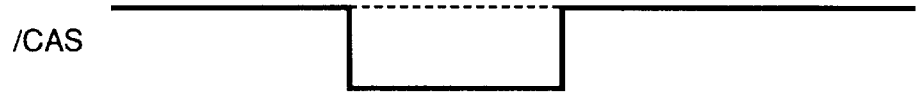
FIG.12C c
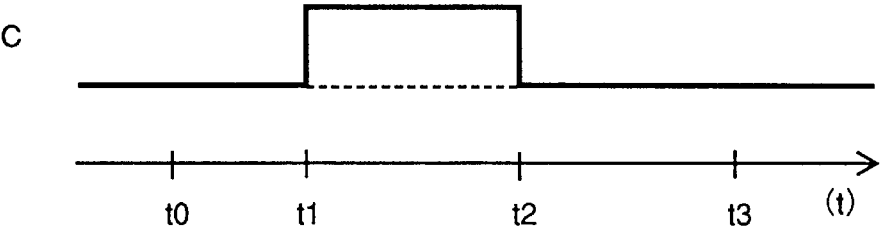

 FIG.16A  C
 FIG.16B  /WE
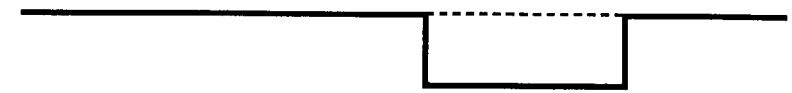 FIG.16C  /OE2
 FIG.16D  DQ1
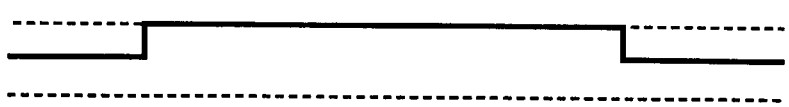 FIG.16E  DB1
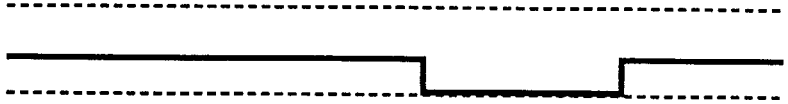 FIG.16F  DB2
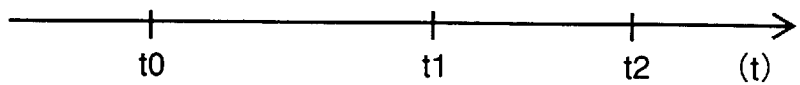

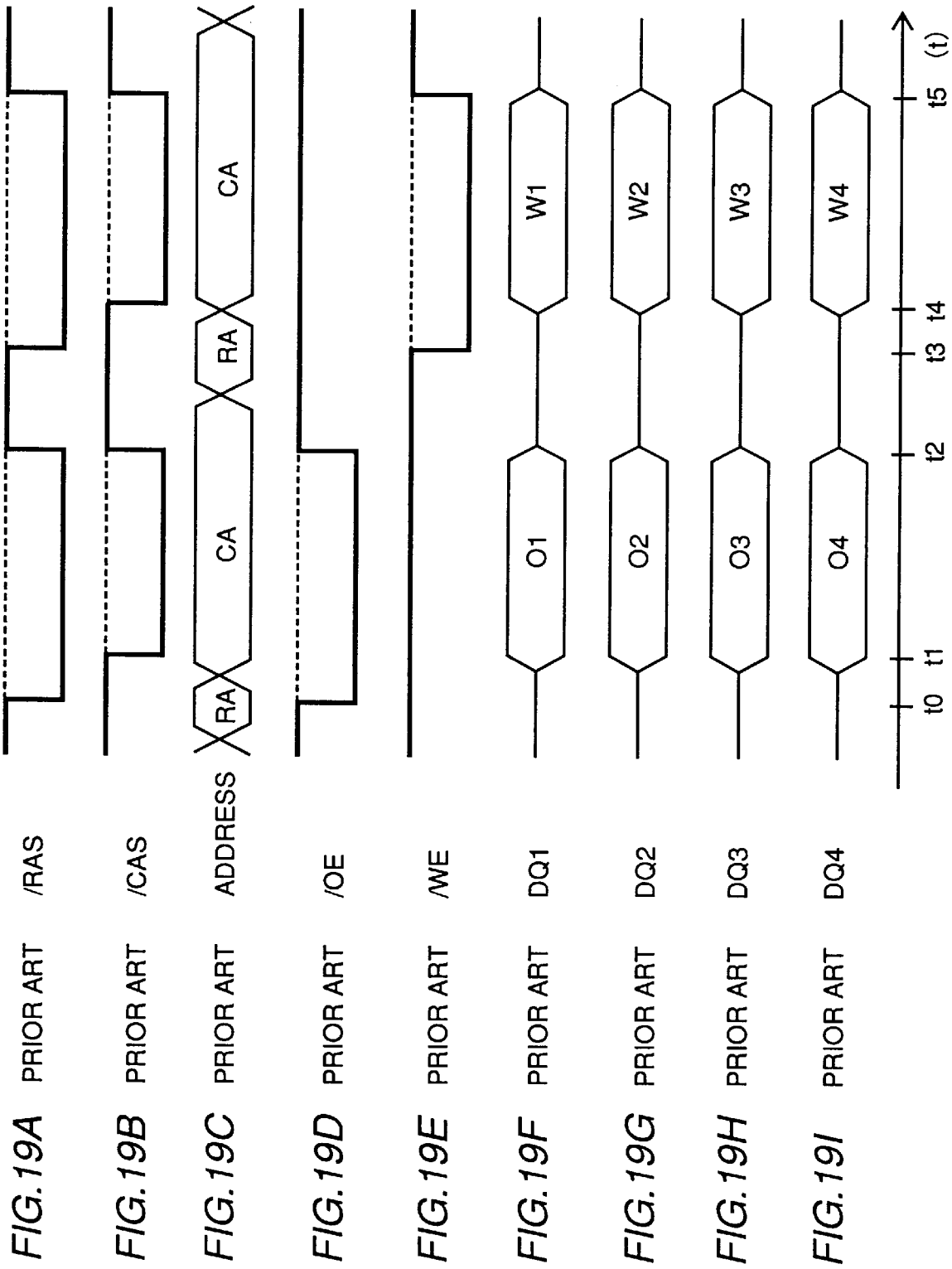

SEMICONDUCTOR MEMORY DEVICE HAVING MEMORY CELL ARRAY DIVIDED INTO A PLURALITY OF MEMORY BLOCKS

BACKGROUND OF THE INVENTION

1. Field of the Invention

The present invention relates to a semiconductor memory device, and particularly to a semiconductor memory device having a plurality of memory blocks in which specific memory cells are selected by a common address signal so that a write operation or a readout operation can be performed to the selected memory cells.

2. Description of the Background Art

In a semiconductor memory device, particularly a dynamic random access memory (hereinafter referred to as DRAM), its increased capacity has caused problems such as increase in power consumption as well as reduction in speed of access to a specific memory cell.

As an approach to solve this problem, a DRAM having a memory cell array divided into a plurality of independent memory blocks has been developed, and is already being manufactured.

FIG. 17 is a block diagram showing a structure of a conventional DRAM including a plurality of memory blocks.

Referring to FIG. 17, a DRAM 500 includes a memory cell array 50 which is divided into four memory blocks #1 to #4.

FIG. 18 is a circuit diagram schematically showing a structure of a memory block in conventional DRAM 500.

Memory block #1 includes a plurality of memory cells MC arranged in a plurality of rows and columns (only one memory cell is illustrated in the FIG. 18 for simplification of the description). Memory cells MC are connected by word lines in the direction of the rows, and are connected by bit line pairs BL and /BL in the direction of the columns. Bit line pairs BL, /BL (the sign "/" denotes inversion, negation, complement or the like) are connected to corresponding sense amplifiers 56, respectively. In addition, bit line pairs BL, /BL are further connected to a data bus DB1 via corresponding I/O gates 57, respectively. Each I/O gate 57 is controlled by a corresponding column selecting line CSL.

Structures of memory blocks #2 to #4 are the same as that of memory block #1 shown in FIG. 18, and external data communication to and from memory block #2, to and from memory block #3, and to and from memory block #4 is performed via data buses DB4, DB2, DB3, and DB4, respectively.

Referring to FIG. 17, DRAM 500 further includes an internal control signal generating circuit 51. Internal control signal generating circuit 51 performs conversion of an *RAS signal (row address strobe signal) input from an *RAS pin into an /RAS signal (internal row address strobe signal), a *CAS signal (column address strobe signal) input from a *CAS pin into a /CAS signal (internal column address strobe signal), a *WE signal (write enable signal) input from a *WE pin into a /WE signal (internal write enable signal), and an *OE signal (output enable signal) input from an *OE pin into an /OE signal (internal output enable signal). These internal control signals are then output. Internal control signal generating circuit 51 generates another internal control signal /XE from these internal control signals for controlling internal circuits included in DRAM 500 which will be described hereinbelow.

DRAM 500 further includes an address buffer 52, a row decoder 53 and a column decoder 54.

Address buffer 52 incorporates an address signal ($A_0, \ldots, A_N$) input from address terminals $a_0, \ldots, a_N$ according to /RAS signal output from internal control signal generating circuit 51 to produce an internal row address signals ($X_0, \ldots, X_N$).

Row decoder 53 decodes internal row address signal ($X_0, \ldots, X_N$) and selects corresponding word lines WL in respective memory blocks #1 to #4. Upon the rise of potential of each selected word line WL, a sense amplifier 56 corresponding to each memory cell MC connected to each selected word line WL is operated and slight difference which had been produced between corresponding bit lines BL and /BL is amplified.

In addition, address buffer 52 incorporates an address signals ($A_0, \ldots, A_N$) input from address terminals $a_0, \ldots, a_N$ according to /CAS signal output from internal control signal generating circuit 51 to produce an internal column address signal ($Y_0, \ldots, Y_N$).

Column decoder 54 decodes internal column address signal ($Y_0, \ldots, Y_N$) and selects corresponding column selecting lines CSL in respective memory blocks #1 to #4. Upon the rise of potential of each selected column selecting line CSL, a corresponding bit line pair BL, /BL is connected to a corresponding one of data busses DB1 to DB4 via a corresponding I/O gate 57.

As a result, when write operation is performed, data input from the external terminal is conducted to a corresponding one of data busses DB1 to DB4 via input/output circuit which will be described later, and then to corresponding bit lines BL and /BL, so as to be written into a specific memory cell MC.

When readout operation is performed, potential of bit lines BL and /BL is conducted to a corresponding one of data busses DB1 to DB4, and then to the input/output circuit which will be described later, so as to be output to the external terminal as a result.

DRAM 500 further includes main amplifiers 60 to 63, data output buffer circuits 70 to 73, and data input buffer circuits 80 to 83.

Main amplifier 60 amplifies a signal on data bus DB1 of memory block #1. Main amplifier 61 amplifies and outputs a signal on data bus DB2 of memory block #2. Main amplifier 62 amplifies a signal on data bus DB3 of memory block #3. Main amplifier 63 amplifies a signal on data bus DB4 of memory block #4.

Data output buffer circuit 70 produces external readout data from the output signal of main amplifier 60 according to /OE signal output from internal control signal generating circuit 51 and outputs the produced signal to an external terminal DQ1. Data output buffer 71 produces external readout data from the output signal of main amplifier 61 also according to /OE signal and outputs the produced signal to an external terminal DQ2. Data output buffer circuit 72 produces external readout data from the output signal of main amplifier 62 also according to /OE signal and outputs the produced signal to external terminal DQ3. Data output buffer circuit 73 produces external readout data from the output signal of main amplifier 63 also according to /OE signal and outputs the produced signal to external terminal DQ4.

Data input buffer circuit 80 receives external write data input from external terminal DQ1 to produce internal write data to be written into a specific memory cell MC of memory block #1 according to /WE signal output from internal control signal generating circuit 51, and conducts the produced signal to data bus DB1. Data input buffer circuit 81 receives external write data input from external terminal DQ2 to produce internal write data to be written into a specific memory cell MC of memory block #2 also according to /WE signal and conducts the produced signal to data bus DB2. Data input buffer circuit 82 receives external write data input from external terminal DQ3 to produce internal write data to be written into a specific memory cell MC of memory block #3 also according to /WE signal, and conducts the produced signal to data bus DB3. Data input buffer circuit 83 receives external write data input from external terminal DQ4 to produce internal write data to be written into a specific memory cell MC of memory block #4, and conducts the produced signal to data bus DB4.

Description will now be made in the following for the timings of readout operation and write operation in DRAM 500. FIGS. 19A–19I are timing charts for readout and write operations in the conventional DRAM 500 having four memory blocks. In FIGS. 19A–19I, RA is for internal row address signal while CA is for internal column address signal.

At time t0 when /OE signal falls to L level, readout operation is initiated.

Simultaneously, when /RAS signal falls to L level, address buffer 52 externally incorporates an address signal ($A_0, \ldots, A_N$) to produce an internal row address signal ($X_0, \ldots, X_N$). When row decoder 53 receives this signal, it activates a corresponding word line WL in each of memory blocks #1 to #4.

At time t1 when /CAS signal falls to L level, address buffer 52 externally incorporates an address signal ($A_0, \ldots, A_N$) to produce an internal column address signal ($Y_0, \ldots, Y_N$). When column decoder 54 receives this signal, it activates a corresponding column selecting line CSL in each of memory blocks #1 to #4, so that data busses DB1 to DB4 are connected to corresponding bit line pairs BL, /BL, respectively.

As a result, respective signals on data busses DB1 to DB4 are amplified by main amplifiers 60 to 63 and then are converted into external readout data 01, 02, 03 and 04 at data output buffer circuits 70 to 73 to be output from external terminals DQ1 to DQ4, respectively.

At time t2 when /OE signal rises to H level, the readout operation is terminated. In addition, when /RAS and /CAS signals rise to H level at time t2, memory blocks #1 to #4 are deactivated.

Then, write operation is initiated when /WE signal falls to L level at time t3.

During the period between time t3 and time t4, similarly to the period between time t0 to t1, fall of /RAS and /CAS signals to L level causes activation of specific word lines WL in respective memory blocks #1 to #4 while data busses DB1 to DB4 are connected to specific bit line pairs BL, /BL in respective memory blocks #1 to #4.

As a result, external write data W1, W2, W3, W4 input from respective ones of external terminals DQ1 to DQ4 are converted into internal write data at data input buffer circuits 80 to 83, and thereafter, are conducted to data busses DB1 to DB4 so as to be written into specific memory cells of memory blocks #1 to #4, respectively.

At time t5 when /WE signal rises to H level, the write operation is terminated. In addition, when /RAS and /CAS signals rise to H level at time t5, memory blocks #1 to #4 are deactivated.

As described above, the conventional semiconductor memory device has a structure in which a memory cell array is divided into a plurality of blocks upon operation, in order to solve the problems mentioned above caused from increase in storage capacity.

However, in such a structure, it is necessary to prepare input/output pins as many as the divided memory blocks, and to provide internal circuits relating to input/output corresponding to each of the input/output pins (for example, a main amplifier, a data input buffer circuit, data output buffer circuit). As a result, the circuitry must be designed to accommodate the number of the memory blocks, and as the number of memory blocks is increased, there would be a problem of increase in the chip area.

Particularly, given the fact that there is a trend in this technical field for large capacity of a memory cell array and thus the number of memory blocks included in a single chip to be further increased, growing chip area has become an inevitable problem.

SUMMARY OF THE INVENTION

Based on the foregoing, it is an object of the present invention to provide a semiconductor memory device in which a plurality of memory blocks can be operated without increase in chip area caused by increase in the number of the memory blocks.

A semiconductor memory device according to the present invention includes a plurality of memory blocks in which specific memory cells are selected simultaneously by a common address signal. The semiconductor memory device further includes a signal generating circuit responsive to a plurality of input signals respectively from a plurality of external terminals for generating a plurality of control signals. The plurality of memory blocks are divided to form a plurality of groups each of which includes the same number of memory blocks. The memory device further includes a plurality of output control circuits each provided for a corresponding one of the groups for selectively and externally outputting readout data from either one of the memory blocks belonging to the each group according to the plurality of control signals, a plurality input control circuits each provided for a corresponding one of the groups for selectively rendering externally input data into write data of either one of the memory blocks belonging to each of the groups according to the plurality of control signals, and a plurality of data input/output terminals each provided for a corresponding one of the groups to be commonly employed for external data output of the output control circuit and external data input of the input control circuit for the corresponding one of the groups.

In accordance with another aspect of the present invention, a semiconductor memory device includes a plurality of memory blocks in which a common address signal selects specific memory cells simultaneously. The semiconductor memory device further includes a signal generating circuit for receiving a first input signal from a first external terminal, a second input signal from a second external terminal, and a third input signal from a third external terminal to generate control signals. The plurality of memory blocks are divided to form groups each of which includes two memory blocks. The memory device further includes a plurality of output control circuits each provided for a corresponding one of the groups for selectively and externally outputting readout data from either one of the two memory blocks belonging to each of the groups according to the control signals, and a plurality of input control circuits each provided for a corresponding one of the groups for selectively rendering the externally input data into write data of either one of the two memory blocks belonging to each of the groups. External data output of output control circuit and external data input of input control circuit are performed by a single data input/output terminal commonly employed in each group.

In accordance with a further aspect of the present invention, a semiconductor memory device includes a plurality of memory blocks in which specific memory cells are selected simultaneously by a common address signal. The semiconductor memory device further includes a signal generating circuit for receiving a first input signal from a first external terminal and a second input signal from a second external terminal to generate a control signal. The plurality of memory blocks are divided to form groups each of which includes two memory blocks. The memory device further includes a plurality of output control circuits each provided for a corresponding one of the groups for selectively and externally outputting a readout data from either one of the two memory blocks belonging to each of the groups according to the control signal as well as a third input signal from a third external terminal and a fourth input signal from a fourth external terminal, and a plurality of input control circuits each provided for a corresponding one of the groups for selectively rendering externally input data into a write data for either one of the two memory blocks belonging to each of the groups in response to the control signal and the fourth input signal. External data output of output control circuit and external data input of input control circuit are performed by a single data input/output terminal commonly employed in each group.

Accordingly, the main advantage of the present invention is that each of an input circuit and an output circuit for one group is commonly employed by memory blocks of the group and input and output circuits for one group share one external terminal such that increase in the chip area can be suppressed.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a schematic circuit diagram showing a structure of a portion of an internal control signal generating circuit according to the first embodiment of the present invention.

FIGS. 4A–4E are timing charts for illustrating the relationship between input and output signals of the internal control signal generating circuit according to the first embodiment of the present invention.

FIG. 11 is a schematic circuit diagram showing a structure of a portion of an internal control signal generating circuit according to a second embodiment of the present invention.

FIGS. 12A–12C are timing charts for illustrating the relationship between input and output signals of the internal control signal generating circuit according to a second embodiment of the present invention.

FIGS. 16A–16F are timing charts for illustrating the relationship between input and output signals of the data input buffer circuit according to the second embodiment of the present invention.

FIGS. 19A–19I are timing charts for illustrating the readout and write operations in the conventional semiconductor memory device having four memory blocks.

DESCRIPTION OF THE PREFERRED EMBODIMENTS

[First Embodiment]

Figure 1:
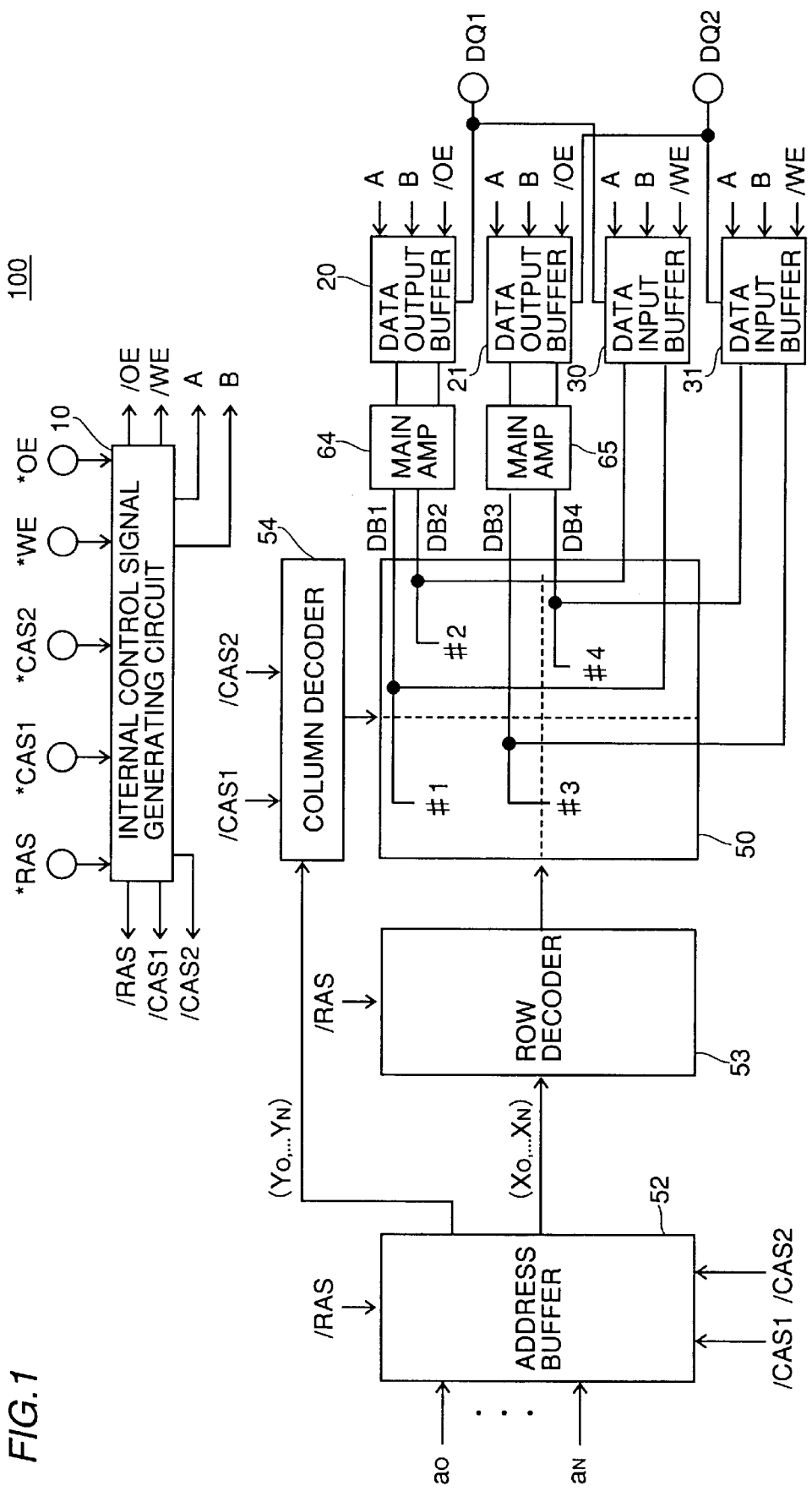
FIG. 1 is a schematic block diagram showing a structure of a semiconductor memory device according to a first embodiment of the present invention.
Figure 2:
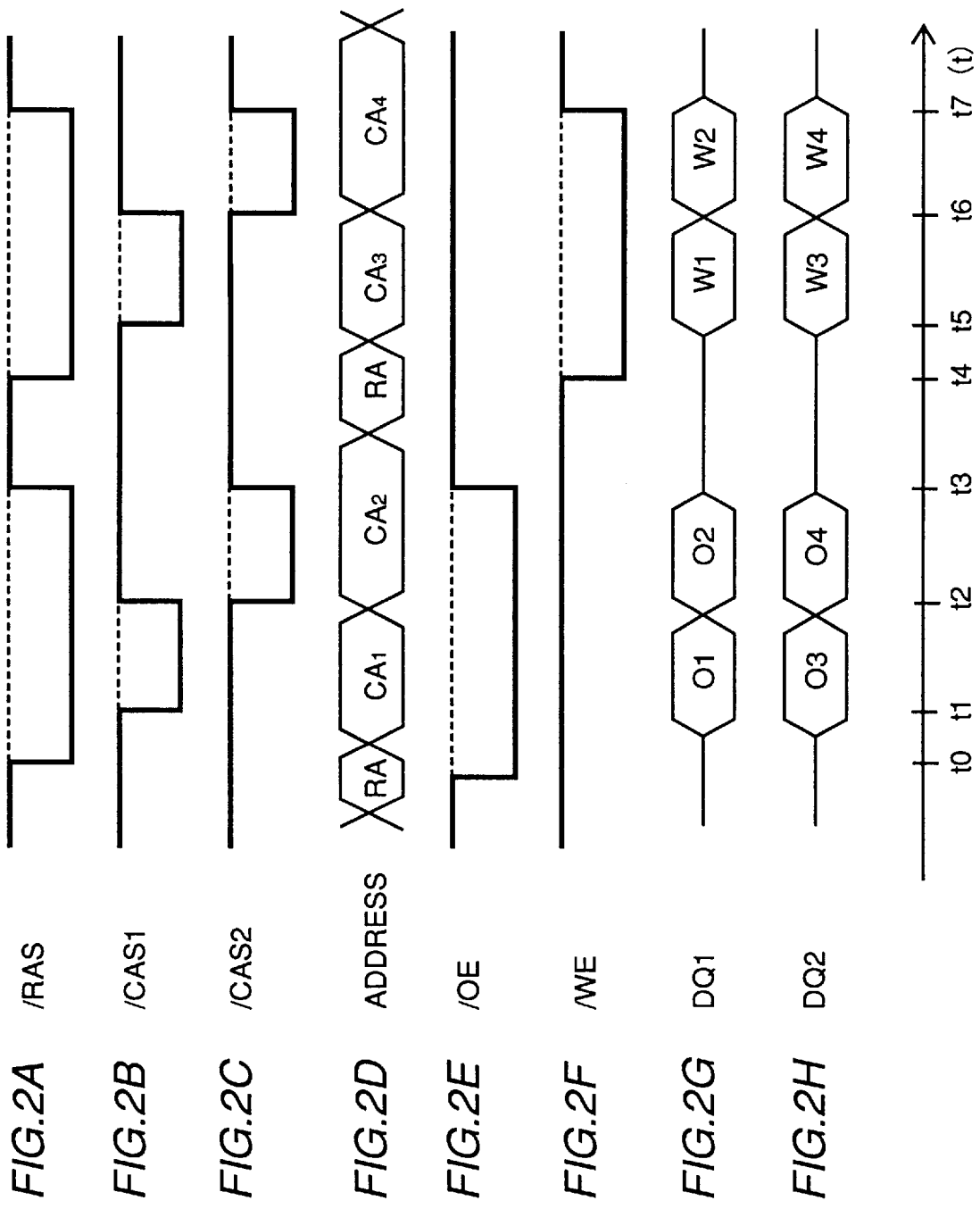
FIGS. 2A–2H are timing charts for illustrating the relationship between readout operation and write operation of a semiconductor memory device according to the first embodiment of the present invention.
Figure 17:
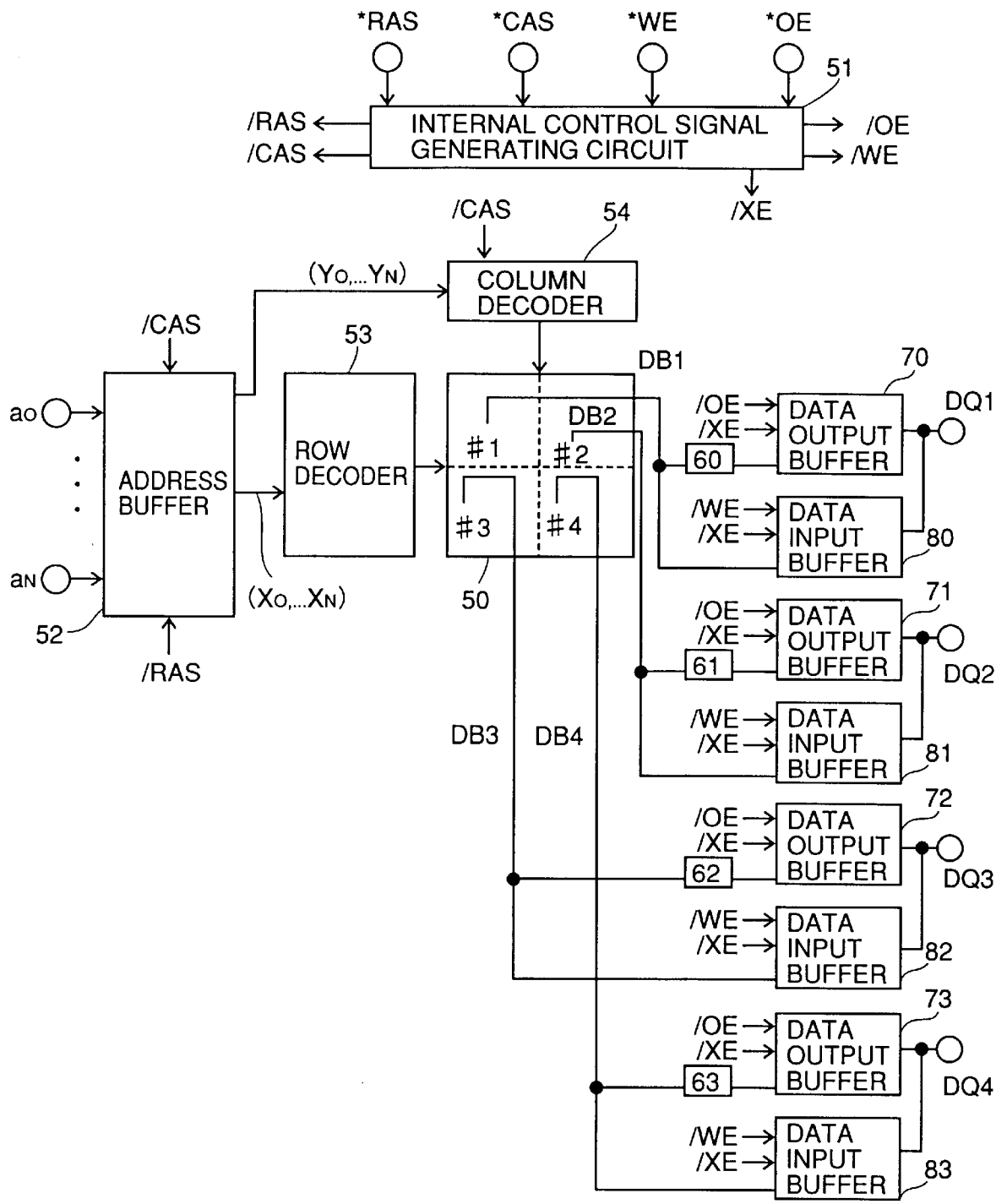
FIG. 17 is a schematic block diagram showing a structure of a conventional semiconductor memory device formed of a plurality of memory blocks.
Figure 18:
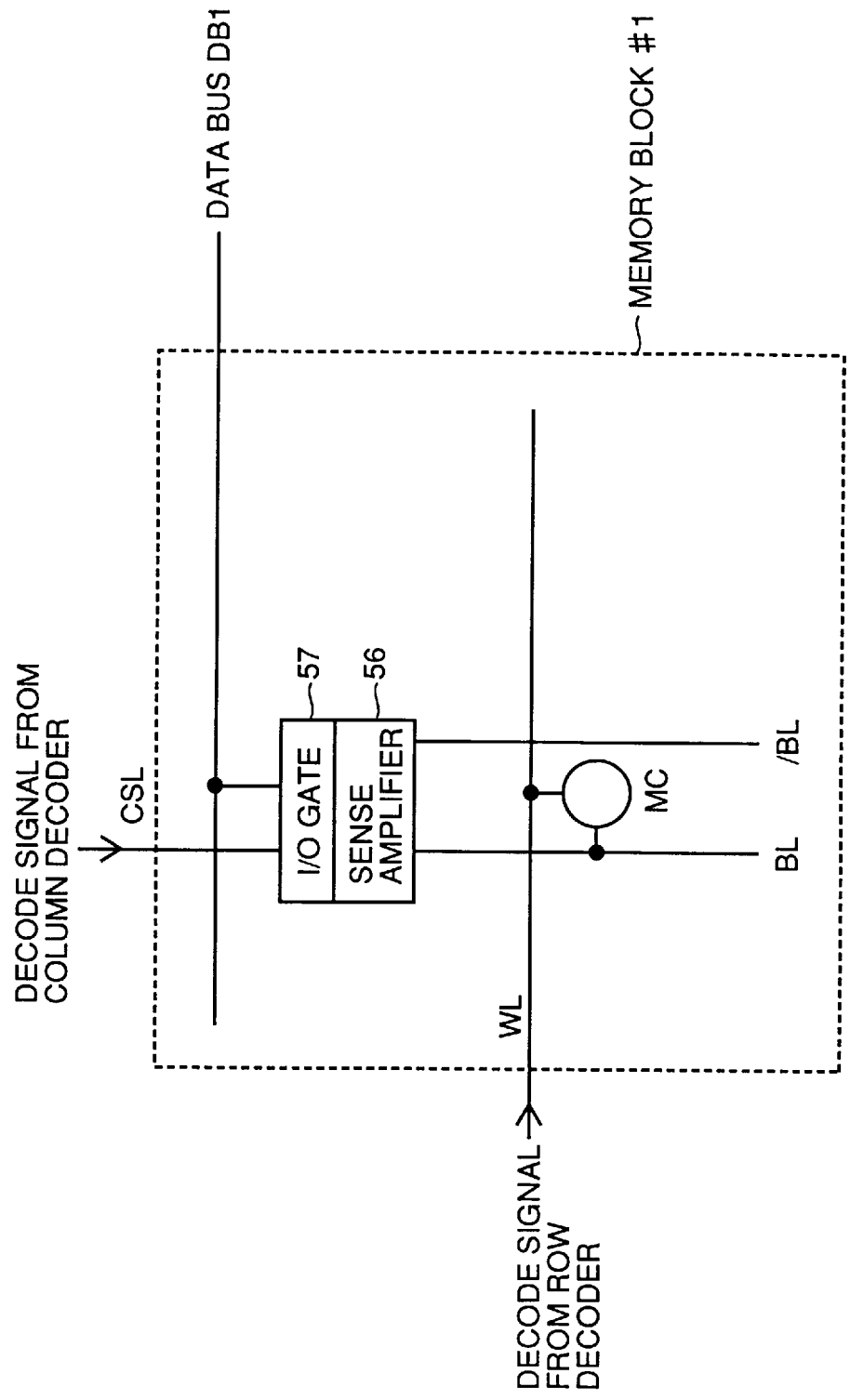
FIG. 18 is a schematic circuit diagram showing a structure of a memory block according to a conventional semiconductor memory device.

FIG. 1 is a schematic block diagram showing the entire structure of a semiconductor memory device 100 according to a first embodiment of the present invention in which components also appearing in the conventional example shown in FIG. 17 are denoted by the same reference characters and description thereof will not be repeated here.

The difference between semiconductor memory device shown in FIG. 1 and the conventional example of FIG. 17 is as follows.

While there is only one terminal for inputting *CAS signal in FIG. 17, the embodiment of FIG. 1 includes two terminals for inputting *CAS1 signal and *CAS2 signal. Instead of internal control signal generating circuit 51 of FIG. 17, the embodiment of FIG. 1 is provided with an internal control signal generating circuit 10 which receives an *RAS signal, a *CAS1 signal, a *CAS2 signal, a *WE signal and an *OE signal at its inputs. Instead of data output buffer circuits 70 to 73 of FIG. 17, the embodiment of FIG. 1 includes a data output buffer circuit 20 shared by memory blocks #1 and #2 as well as a data output buffer circuit 21 shared by memory blocks #3 and #4. Instead of data input buffer circuits 80 to 83 in FIG. 17, the embodiment of FIG. 1 includes a data input buffer circuit 30 shared by memory blocks #1 and #2 as well as a data input buffer circuit 31 shared by memory blocks #3 and #4. Instead of main amplifier 60 to 63, the embodiment of FIG. 1 includes a main amplifier 64 for amplifying signals on data bus DB1 and on data bus DB2 as well as a main amplifier 65 for amplifying signals on data bus DB3 and on data bus DB4. *CAS1 signal input from a *CAS1 pin and *CAS2 signal input from a *CAS2 pin are rendered into a /CAS1 signal and a /CAS2 signal at internal control signal generating circuit 10. These /CAS1 and /CAS2 signals both have the same function as the conventional /CAS signal. Accordingly, when /CAS1 or /CAS2 signal falls to L level while /RAS signal is at L level, address buffer 52 produces an internal column address signal in response to an address signal received externally at the time of fall of /CAS1 or /CAS2 signal to L level.

More particularly, while one memory cell MC belonging to each of the memory blocks #1 to #4 is selected at the time of fall of /CAS1 signal to L level, one memory cell MC belonging to each of memory blocks #1 to #4 is also selected at the time of fall of /CAS2 signal to L level. Referring to FIGS. 2A–2H, RA indicates an internal row address signal while CA1, CA2, CA3 and CA4 indicate internal column address signals.

Semiconductor memory device 100 divides memory blocks #1 to #4 into a group consisting of memory blocks #1 and #2 and a group consisting of memory blocks #3 and #4. A common input circuit and a common output circuit are provided for each group. In addition, input and output of data is performed by the input and output circuits using a common external terminal. Control of write operation and readout operation for each group is performed by control signals (i.e., first control signal A and second control signal B) based on /RAS signal and /CAS1 signal and /CAS2 signal. Specifically, semiconductor memory device 100 selects either one of two memory blocks in each group in accordance with the control signal to perform write or readout operation.

More particularly, readout operation of semiconductor memory device 100 is as follows (when /OE is at L level). When /CAS1 signal is at L level, internal control signal generating circuit 10 produces first control signal A at H level. Consequently, an electric signal O1 corresponding written signal of memory cell MC located at address Z1 of memory block #1 is output from external terminal DQ1, and an electric signal 03 corresponding to written signal of memory cell MC located at address Z1 of memory block #3 is output from external terminal DQ2.

Meanwhile, when /CAS2 is at L level, internal control signal generating circuit 10 produces second control signal B at H level. Consequently, an electric signal O2 corresponding to written signal of memory cell MC located at address Z2 of memory block #2 is output from external terminal DQ2 and an electric signal 04 corresponding to written signal of memory cell MC located at address Z2 of memory block #4 is output from external terminal DQ2.

In addition, write operation of semiconductor memory device 100 is as follows (when /WE is at L level). When /CAS1 signal is at L level, internal control signal generating circuit 10 produces first control signal A at H level. Consequently, input signal W1 received from external terminal DQ1 is written into memory cell MC located at address Z3 of memory block #1, and input signal W3 received from external terminal DQ2 is written into memory cell MC located at address Z3 of memory block #3.

Meanwhile, when /CAS signal is at L level, internal control signal generating circuit 10 produces second control signal B at H level. Consequently, input signal W2 received from external terminal Q1 is written into memory cell MC located at address Z4 of memory block #2, and input signal W4 received from external terminal DQ2 is written into memory cell MC located at address Z4 of memory block #4.

The following is a detailed description of the structure and the operation of semiconductor memory device 100.

Referring to FIG. 3, internal control signal generating circuit 10 additionally includes NOR circuits NOR1 and NOR2. NOR circuit NOR1 receives /RAS and /CAS1 signals generated at internal control signal generating circuit 10 itself and an output signal of NOR circuit NOR2 so as to output first control signal A from output node 1. NOR circuit NOR2 receives /RAS and /CAS2 signals generated at internal control signal generating signal 10 itself and an output signal of NOR circuit NOR1 so as to output second control signal B from output node 2.

Next, operation of circuit shown in FIG. 3 will be described.

Referring to FIGS. 4A–4E, during the period between time t0 and time t1, NOR circuit NOR1 which receives /CAS1 signal at H level outputs a signal at L level to output node 1 regardless of the logical level of output node 2. Meanwhile, NOR circuit NOR2 which receives /CAS2 signal at H level outputs a signal at L level to output node 2 regardless of the logical level of signal at output node 1.

During the period between time t1 and time t2, NOR circuit NOR2 which receives /CAS2 signal at H level outputs a signal at L level to output node 2. Meanwhile, NOR circuit NOR1 which receives /RAS signal at L level, /CAS1 signal at L level and a signal at L level at output node 2 outputs a signal at H level to output node 1.

During the period from time t2 to t3, NOR circuit NOR1 which receives /CAS1 signal at H level outputs a signal at L level to output node 1. Meanwhile, NOR circuit NOR2 which receives /RAS signal at L level, /CAS2 signal at L level and a signal at L level at output node 1 outputs a signal at H level to output node 2.

During the period in which all of /RAS signal, /CAS1 signal, and /CAS2 signal are at H level (i.e., before time t0 and after time t3 in FIG. 3), signal of output node 1 and signal of output node 2 would both be at L level.

Accordingly, the signal of output node 1, that is, first control signal A, would be at H level when /RAS and /CAS1 signals are both at L level, and would be at L level when /CAS1 signal is at H level. Meanwhile, the signal of output node 2, that is, the second control signal B, would be at H level when /RAS and /CAS2 signals are both at L level, and would be at L level when /CAS2 signal is at H level.

Specifically, upon operation of memory in semiconductor memory device 100, internal control signal generating circuit 10 produces two signals (first control signal A and second control signal B) depending on the combination of logical levels of /CAS1 and /CAS2 signals.

Figure 5:
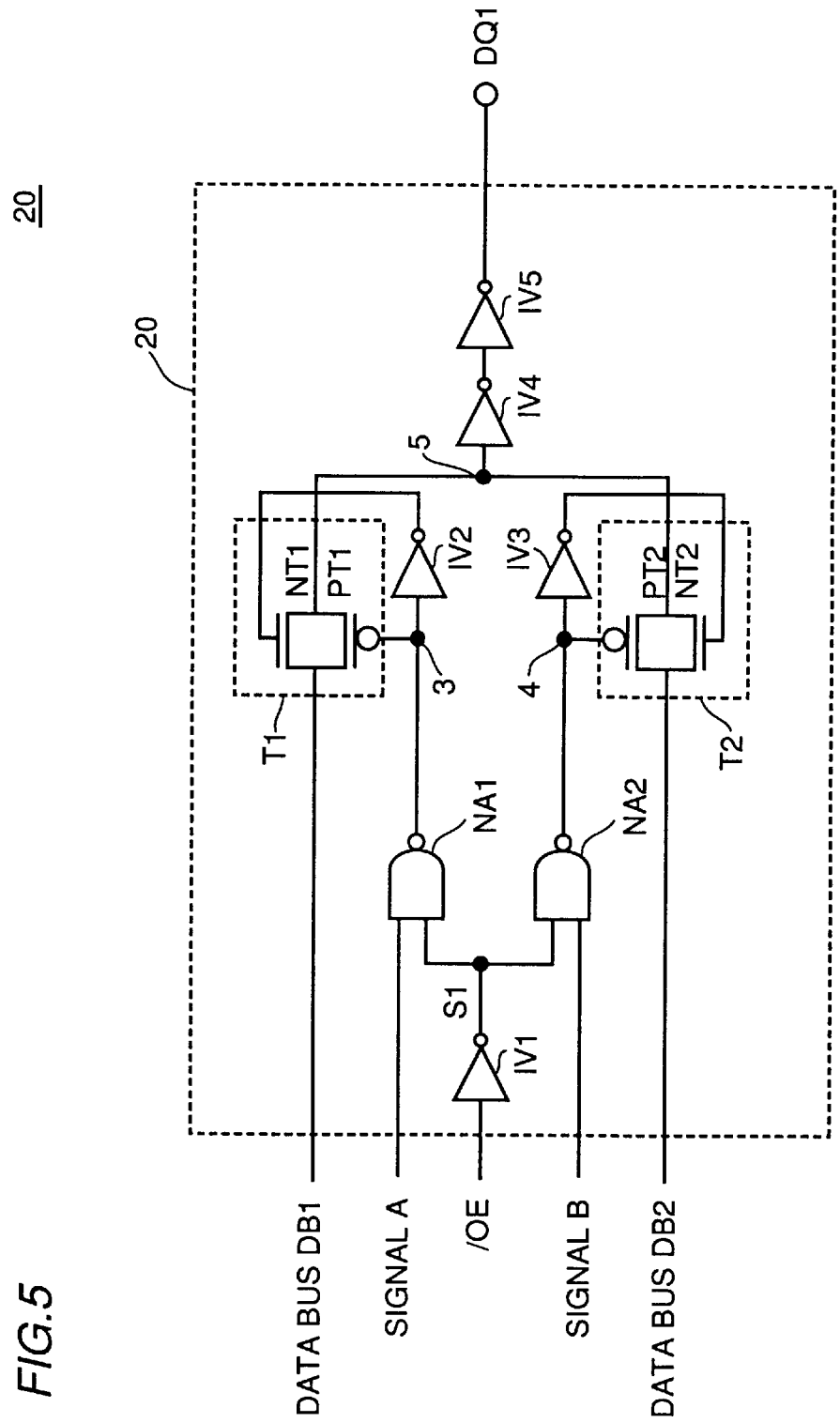
FIG. 5 is a schematic circuit diagram showing a structure of a data output buffer circuit according to the first embodiment of the present invention.

Referring to FIG. 5, data output buffer circuit 20 includes inverter circuits IV1 to IV5, NAND circuits NA1 and NA2, and transfer gates T1 and T2.

Inverter circuits IV1 receives /OE signal and outputs an inversion of this signal as signal S1.

NAND circuit NA1 receives signal S1 and first control signal A from internal control signal generating circuit 10 and outputs the result of operation to node 3.

NAND circuit NA2 receives signal S1 and second control signal B from internal control signal generating circuit 10 and outputs the result of operation to node 3.

Inverter circuit IV2 inverts the signal on node 3. Inverter circuit IV3 inverts the signal on node 4.

Transfer gate T1 includes a P channel MOS transistor (hereinafter abbreviated as PMOS) PT1 and an N channel MOS transistor (hereinafter abbreviated as NMOS) NT1.

PMOS PT1 and NMOS NT1 respectively has one conductive terminals connected at node 5, and the other conductive terminals connected to data bus DB1 of memory block #1. In addition, PMOS PT1 receives the signal on node 3 at its gate while NMOS NT1 receives the output signal of inverter circuit IV2 (i.e., inversion of the signal on node 3) at its gate.

Transfer gate T2 includes a PMOS PT2 and an NMOS NT2.

PMOS PT2 and NMOS NT2 respectively has one conductive terminals connected at node 5, and the other conductive terminals connected to data bus DB2 of memory block #2. In addition, PMOS PT2 receives the signal on node 4 at its gate while NMOS NT2 receives the output signal of inverter circuit IV3 (i.e., inversion of the signal on node 4) at its gate.

Inverter circuit IV4 is connected with node 5, and receives outputs of transfer gates T1 and T2 to be inverted and amplified. Meanwhile, inverter circuit IV5 inverts and amplifies the output of inverter circuit IV4 which is then output to external terminal DQ1.

Data output buffer circuit 21 and data output buffer circuit 20 are of the same structure, circuit 21 employing data bus DB3 instead of data bus DB1 as input line, data bus DB4 instead of data bus DB2 as input line, and external terminal DQ2 instead of external terminal DQ1 as output terminal.

Figure 6:
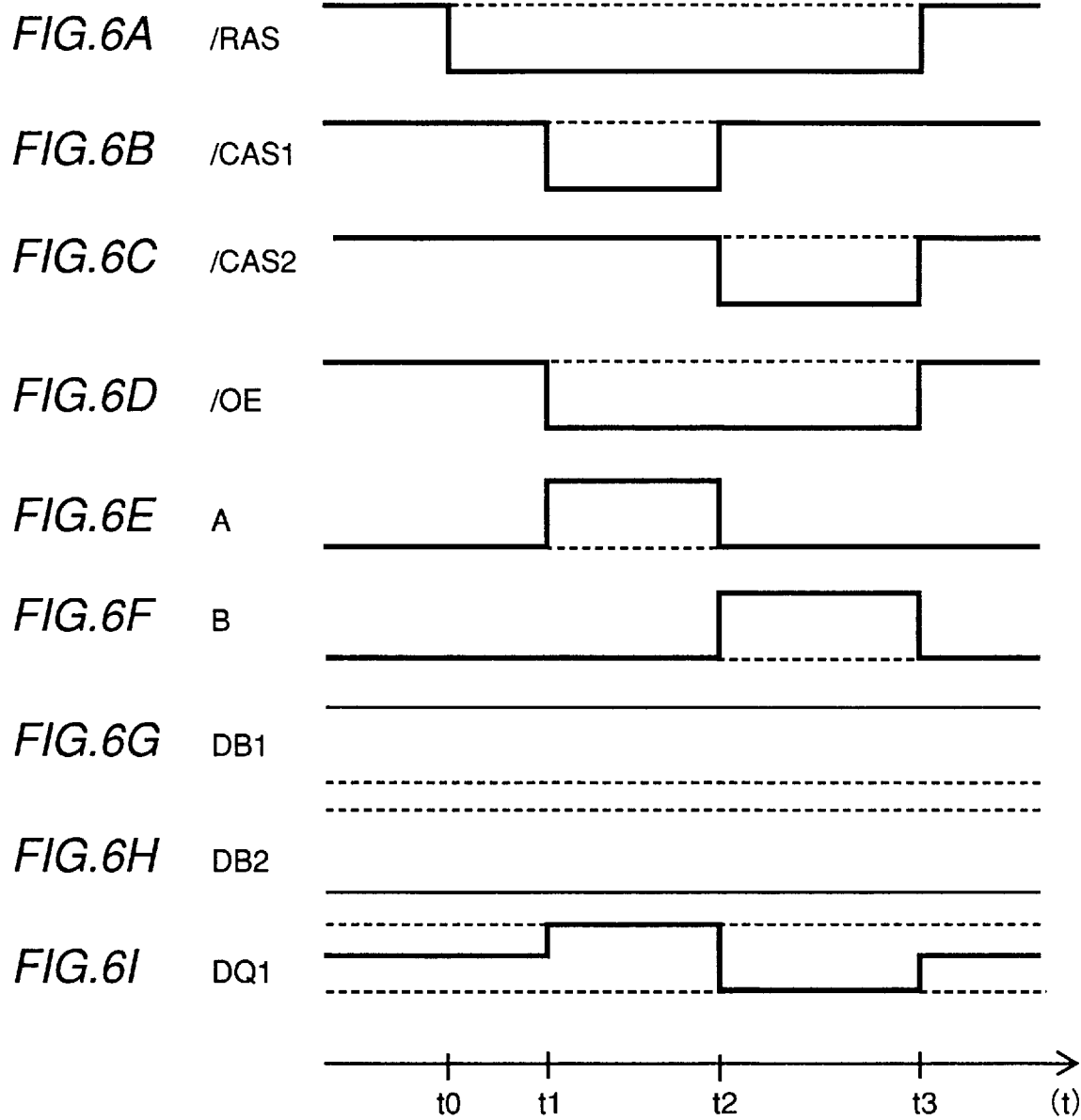
FIGS. 6A–6I are timing charts for illustrating the relationship between input and output signals of the data output buffer circuit according to the first embodiment of the present invention.

As has been described already with reference to FIG. 3, internal control signal generating circuit 10 receives *RAS signal, *CAS1 signal and *CAS2 signal to produce first control signal A and second control signal B shown in FIGS. 6E and 6F.

Referring to FIGS. 6A–6I, when /RAS signal falls to L level at time 0O which is followed by time t1 at which /CAS1 signal falls to L level, a specific memory cell MC of each of memory blocks #1 to #4 is selected. Thereafter, since /OE signal falls to L level at time t1, readout operation of data is performed from these specific memory cells MC via data busses DB1 to DB4.

When /CAS signal rises to H level at time t2, these specific memory cells MC would be in non-selected state. Thereafter, when /CAS2 signal newly falls to L level, a specific memory cell MC of each of memory blocks #1 to #4 is selected, and readout operation is performed via data busses DB1 to DB4.

In addition, during the period in which /OE signal is at L level (period between t1 and t3 of FIG. 6D), signal S1 output by inverter circuit IV1 in FIG. 5 is at H level.

During the period between times t1 and t2, NAND circuit NA1 which receives signal S1 at H level and first control signal A outputs a signal of L level onto node 3. Transfer gate T1 receives at the gate of PMOS PT1 the signal at L level on node 3 and receives at the gate of NMOS NT1 a signal at H level, which is a signal obtained by inverting the signal on node 3 with inverter circuit IV2. As a result, transfer gate T1 is rendered conductive.

Meanwhile, NAND circuit NA2 receives signal S1 at H level and second control signal B at L level and outputs a signal at H level onto node 4. Transfer gate T2 receives at the gate of PMOS PT2 the signal at H level on node 4 and receives at the gate of NMOS NT2 a signal at L level, which is a signal obtained by inverting the signal on node 4 with inverter circuit IV3. As a result, transfer gate T2 is rendered non-conductive.

Accordingly, if first control signal A is at H level, an electric signal corresponding to the signal on data bus DB1 of memory block #1 is output from external terminal DQ1 via transfer gate T1.

During the period between times t2 and t3, NAND circuit NA2 which receives signal S1 at H level and second control signal B at H level outputs a signal at L level onto node 4. Transfer gate T2 receives at the gate of PMOS PT2 the signal at L level on node 4 and receives at the gate of NMOS NT2 a signal at H level, which is a signal obtained by inverting the signal on node 4 with inverter circuit IV3. As a result, transfer gate T2 is rendered conductive.

Meanwhile, NAND circuit NA1 receives signal S1 at H level and first control signal A at L level and outputs a signal at H level onto node 3. Transfer gate T1 receives at the gate of PMOS PT1 the signal at H level on node 3 and receives at the gate of NMOS NT1 a signal at L level, which is a signal obtained by inverting the signal on node 3 with inverter circuit IV2. As a result, transfer gate T1 is rendered non-conductive.

Accordingly, if second control signal B is at H level, an electric signal corresponding to the signal on data bus DB2 of memory block #2 is output from external terminal DQ1 via transfer gate T2.

During the period in which /OE signal is at H level, that is, when readout operation is not performed (before time t1 and after time t3 in FIG. 6D), signal S1 output by inverter circuit IV1 is at L level, and thus NAND circuit NA1 which receives this signal outputs a signal at H level to node 3 while NAND circuit NA2 outputs a signal at H level to node 4. As a result, transfer gates T1 and T2 are both rendered non-conductive. Accordingly, data bus DB1 and data bus DB2 would be both electrically disconnected from external terminal DQ1.

Meanwhile, data output buffer circuit 21 employing data bus DB3 of memory block #3 and data bus DB4 of memory block #4 as input lines and external terminal DQ2 as the output terminal performs an operation basically the same as that of data output buffer circuit 20.

More particularly, when /OE signal attains L level and readout operation is performed, control by first control signal A and second control signal B is carried out based on /RAS, /CAS1 and /CAS2 signals, and data of a specific memory cell MC of memory block #1 or #2 is selectively output from external terminal DQ1 while data of a specific memory cell of memory block #3 or #4 being selectively output from external terminal DQ2.

Figure 7:
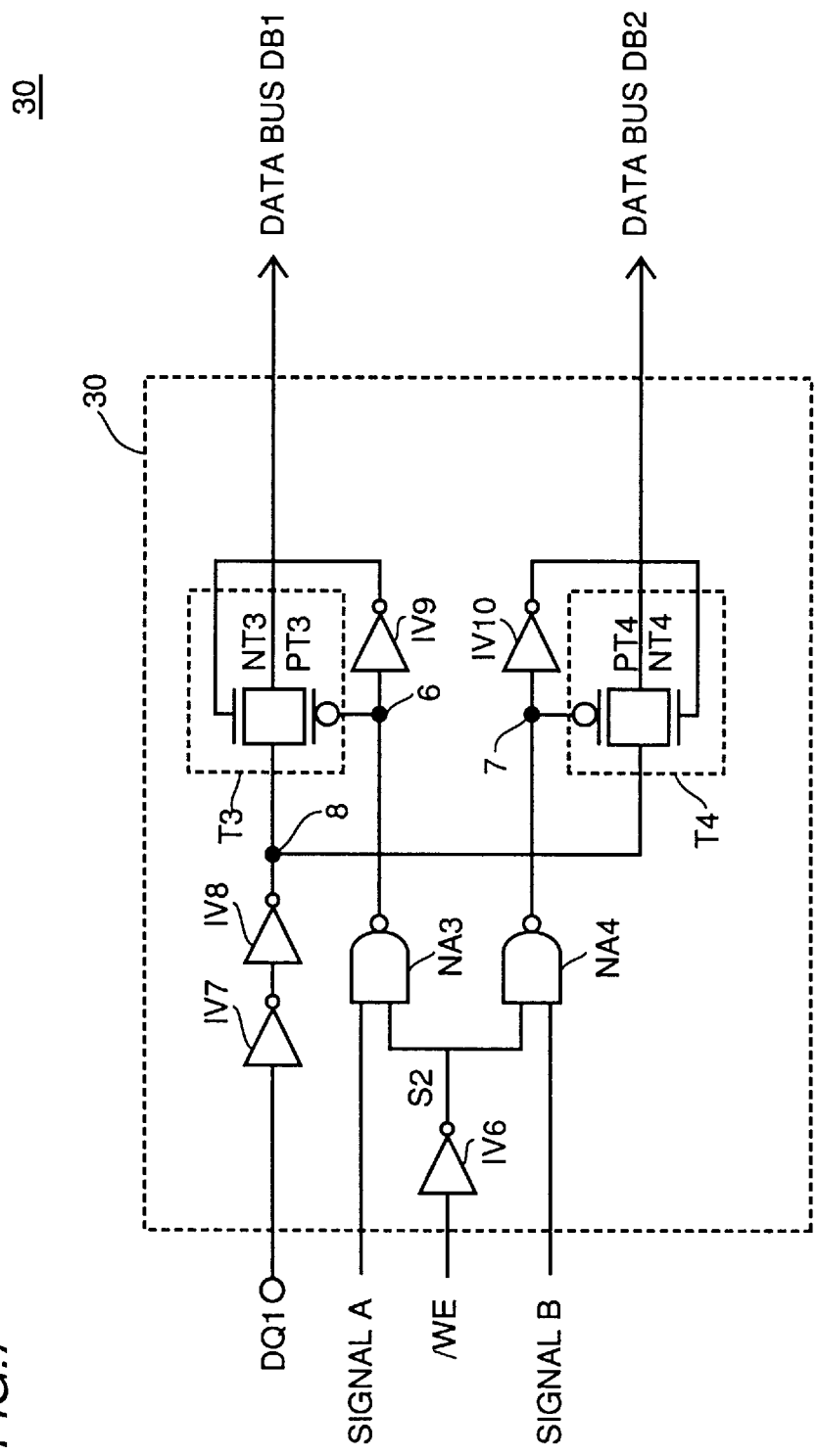
FIG. 7 is a schematic circuit diagram showing a structure of a data input buffer circuit according to the first embodiment of the present invention.

Referring to FIG. 7, data input buffer circuit 30 includes inverter circuits IV6 to IV10, NAND gates NA3, NA4 and transfer gates T3, T4.

Inverter circuit IV6 receives /WE signal, and inverts and outputs this signal as signal S2.

NAND circuit NA3 receives signal S2 as well as first control signal A output from internal control signal generating circuit 10 to output the result of operation to node 6.

NAND circuit NA4 receives signal S2 as well as second control signal B output from internal control signal generating circuit 10 to output the result of operation to node 7.

Inverter circuit IV7 inverts and amplifies the signal received from external terminal DQ1. Meanwhile, inverter circuit IV8 further inverts and amplifies this signal and outputs this to node 8.

Transfer gate T3 includes a PMOS PT3 and an NMOS NT3.

PMOS PT3 and NMOS NT3 each have one conductive terminal connected to data bus DB1 of memory block #1, while the other conductive terminal is connected to node 8. PMOS PT3 receives the signal on node 6 at its gate, and NMOS NT3 receives the output signal of inverter circuit IV9 (i.e., inverted signal of the signal on node 6) at its gate.

Transfer gate T4 includes a PMOS PT4 and an NMOS NT4.

PMOS PT4 and NMOS NT4 each have one conductive terminal connected to data bus DB2 of memory block #2, while the other conductive terminal is connected to node 8. PMOS PT4 receives the signal on node 7 at its gate, and NMOS NT4 receives the output signal of inverter circuit IV10 (i.e., inverted signal of the signal on node 7) at its gate.

Data input buffer circuit 31 has the same structure as that of data input buffer circuit 30, employing external terminal DQ2 instead of external terminal DQ1 for input terminal, data bus DB3 instead of data bus DB1 for output line, and data bus DB4 instead of data bus DB2 for output line.

Figure 8:
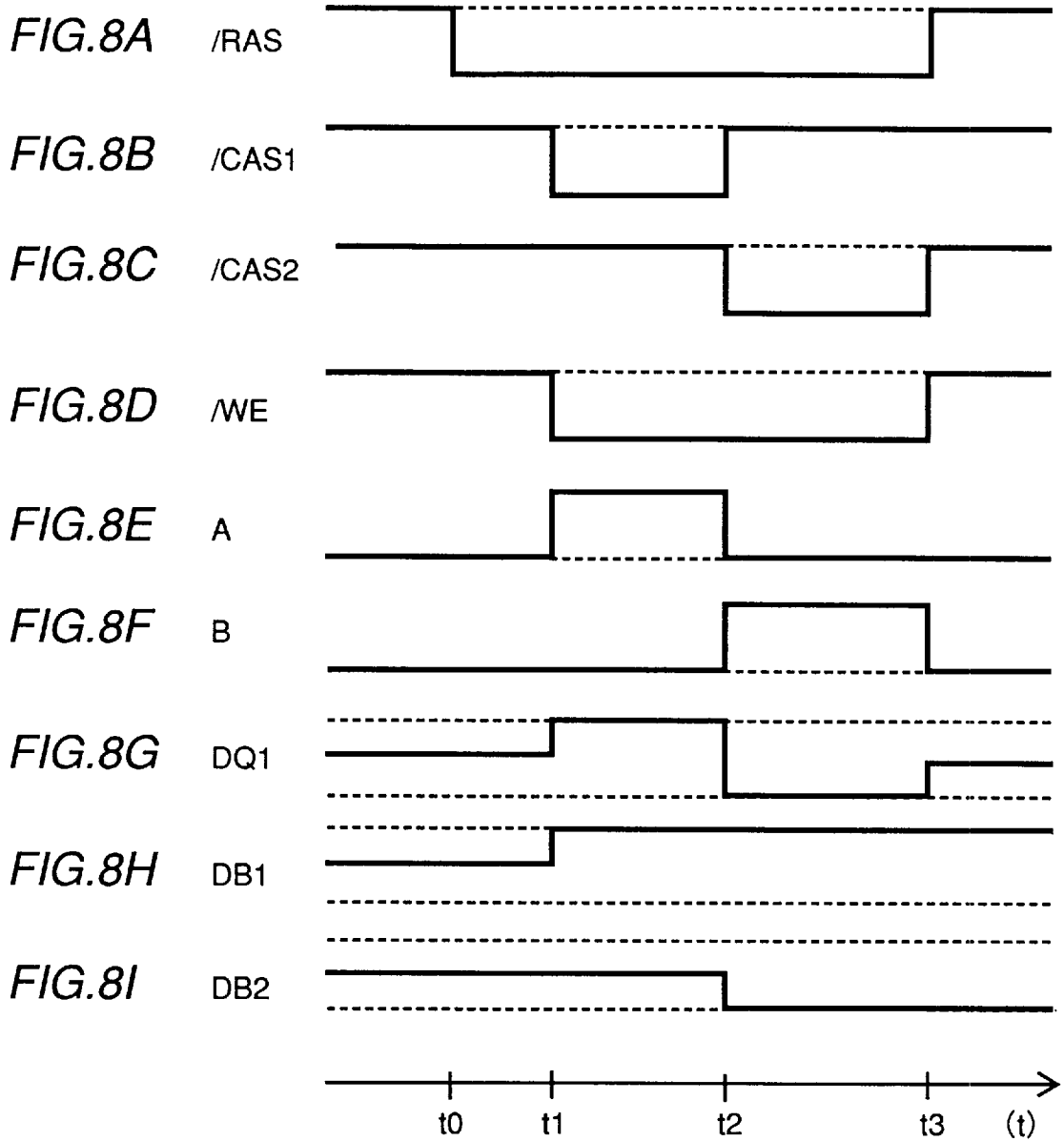
FIGS. 8A–8I are timing charts for illustrating the relationship between input and output signals of the data input buffer circuit according to the first embodiment of the present invention.

As shown in FIG. 3, internal control signal generating circuit 10 produces first control signal A and second control signal B shown in FIGS. 8E and 8F.

Referring to FIGS. 8A–8I, when /RAS signal falls to L level at time t0 followed by time t1 at which /CAS1 signal falls to L level, a specific memory cell MC of each of memory blocks #1 to #4 is selected. Then, when /WE signal falls to L level at time t1, data is written into these specific memory cells MC via data busses DB1 to DB4.

When /CAS1 signal rises to H level at time t2, these specific memory cells MC would be in a non-selected state. Then, when /CAS2 signal newly falls to L level, memory cells MC of respective memory blocks #1 to #4 are selected and data is written via data busses DB1 to DB4.

During the period in which /WE signal is at L level (that is, between time t1 and time t3), signal S2 output from inverter circuit IV6 in FIG. 7 is at H level.

During the period between times t1 and t2, NAND circuit NA3 receives signal S2 of H level and first control signal A at H level and outputs a signal at L level to node 6. Transfer gate T3 receives at the gate of PMOS PT3 signal at L level on node 6 and receives at the gate of NMOS NT3 a signal at H level which is a signal obtained by inverting the signal on node 6 with inverter circuit IV9. As a result, transfer gate T3 is rendered conductive.

Meanwhile, NAND circuit NA4 receives signal S2 at H level and second control signal B at L level and outputs a signal at H level onto node 7. Transfer gate T4 receives at the gate of PMOS PT4 a signal at H level on node N7 and receives at the gate of NMOS NT4 a signal at L level, which is a signal obtained by inverting the signal on node 7 with inverter circuit IV10. As a result, transfer gate T4 is rendered non-conductive.

Accordingly, an electric signal corresponding to signal input from external terminal DQ1 via transfer gate T3 is conducted according to first control circuit A onto data bus DB1 of memory block #1.

During the period between times t2 and t3, NAND circuit NA4 receives signal S2 at H level and second control signal B at H level and outputs a signal at L level to node 7. Transfer gate T4 receives at the gate of PMOS PT4 signal at L level on node 7 and receives at the gate of PMOS NT4 a signal at H level which is a signal obtained by inverting signal on node 7 with inverter circuit IV10. As a result, transfer gate T4 is rendered conductive.

Meanwhile, NAND circuit NA3 receives signal S2 at H level and first control signal A at L level and outputs a signal at H level onto node 6. Transfer gate T3 receives a signal at H level on node N6 at the gate of PMOS PT3 and receives at the gate of NMOS NT3 a signal at L level which is a signal obtained by inverting the signal on node 6 with inverter circuit IN9. As a result, transfer gate T3 is rendered non-conductive.

Accordingly, an electric signal corresponding to signal input from external terminal DQ1 via transfer gate T4 is conducted according to second control signal B onto data bus DB2 of memory block #2.

During the period in which /WE signal is at H level, that is, when write operation is not performed (i.e., before time t1 and after time t3) in FIG. 8D, signal S2 output by inverter circuit IV6 is at L level, and thus NAND circuit NA3 which receives this signal then outputs a signal at H level to node 3, and NAND circuit NA4 outputs a signal at H level to node 7. As a result, transfer gates T3 and T4 are both rendered conductive. Therefore, data bus DB1 and data bus DB2 would be both electrically disconnected from external terminal TQ1.

It may be noted that data input buffer circuit 31 employing data bus DB3 of memory block #3 and data bus DB4 of memory block #4 as output lines and external terminal DQ2 as input terminal basically perform the same operation as that of data input buffer circuit 30.

More specifically, when /WE signal attains L level and write operation is performed, control by first control signal A and second control signal B is carried out based on /RAS, /CAS1 and /CAS2 signals to selectively write the data received from external terminal DQ1 to a specific memory cell MC of memory block #1 or memory block #2, and to selectively write the data received from external terminal DQ2 to a specific memory cell MC of memory block #3 or memory block #4.

As has been described above, in accordance with the first embodiment of the present invention, in semiconductor memory device 100, memory blocks #1 to #4 are divided into two groups, each of input and output circuits being commonly employed for memory blocks of each group, and input and output circuits for each group sharing a common external terminal. In addition, either one of the two memory blocks in each group can be selected by control signals based on externally input /RAS, /CAS1 and /CAS2 signals so as to perform write or readout operation.

Although description has been given for four blocks with respect to the first embodiment of the present invention, the present invention is also feasible with a semiconductor device having 2K memory blocks by providing K input circuits, K output circuits, and K external terminals.

Meanwhile, by increasing the number of external terminals for inputting /CAS signals to use four /CAS signals thereby producing four control signals, it is also possible to form a group of four memory blocks and to selectively output either one of the readout data of the four memory blocks from one external terminal and to selectively write the input data from one external terminal to either one of the four memory blocks.

[Second Embodiment]

Figure 9:
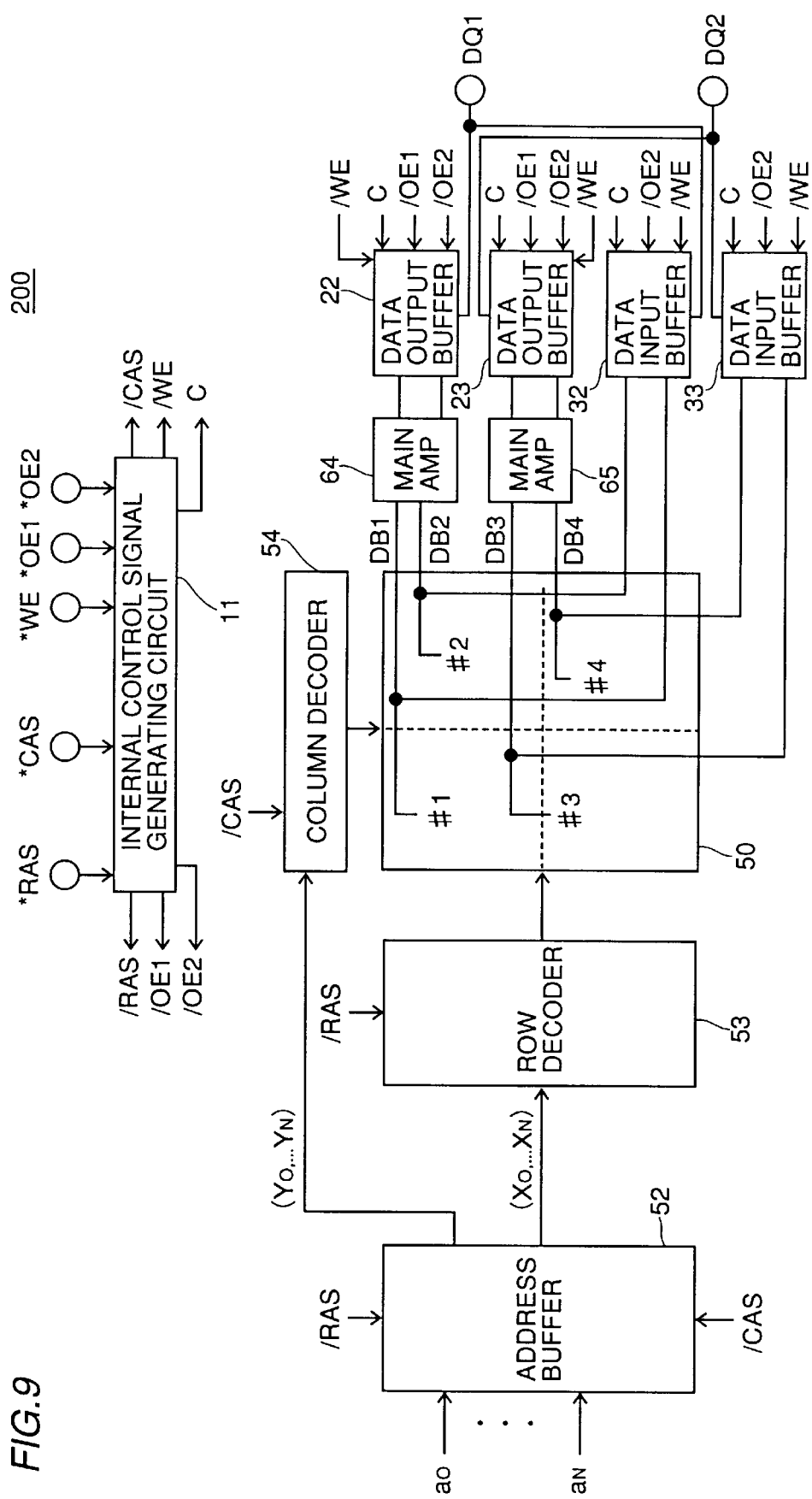
FIG. 9 is a schematic block diagram showing a structure of a semiconductor memory device according to a second embodiment of the present invention.

FIG. 9 is a is a schematic block diagram showing an entire structure of a semiconductor memory device 200 according to a second embodiment of the present invention. Components in common to the present embodiment and the conventional example shown in FIG. 17 are denoted by identical reference characters, and description thereof is not provided here.

Semiconductor memory device 200 according to the second embodiment of the present invention differs from the conventional example of FIG. 17 in the following points. Specifically, it includes two terminals for inputting *OE1 and *OE2 signals while the conventional example included one terminal for inputting the *OE signal, includes an internal control signal generating circuit 11 instead of internal control signal generating circuit 51, includes data output buffer circuits 22 and 23 instead of data output buffer circuit 70 to 73, includes data input buffer circuits 32 and 33 instead of data input buffer circuits 80 to 83, and includes main amplifiers 64 and 65 instead of main amplifier 60 to 63.

*OE1 signal input from *OE1 pin and *OE2 signal input from *OE2 pin become /OE1 signal and /OE2 signal at internal control signal generating circuit 11. These /OE1 and /OE2 signals both have the same function as the conventional /OE signal.

Figure 10:
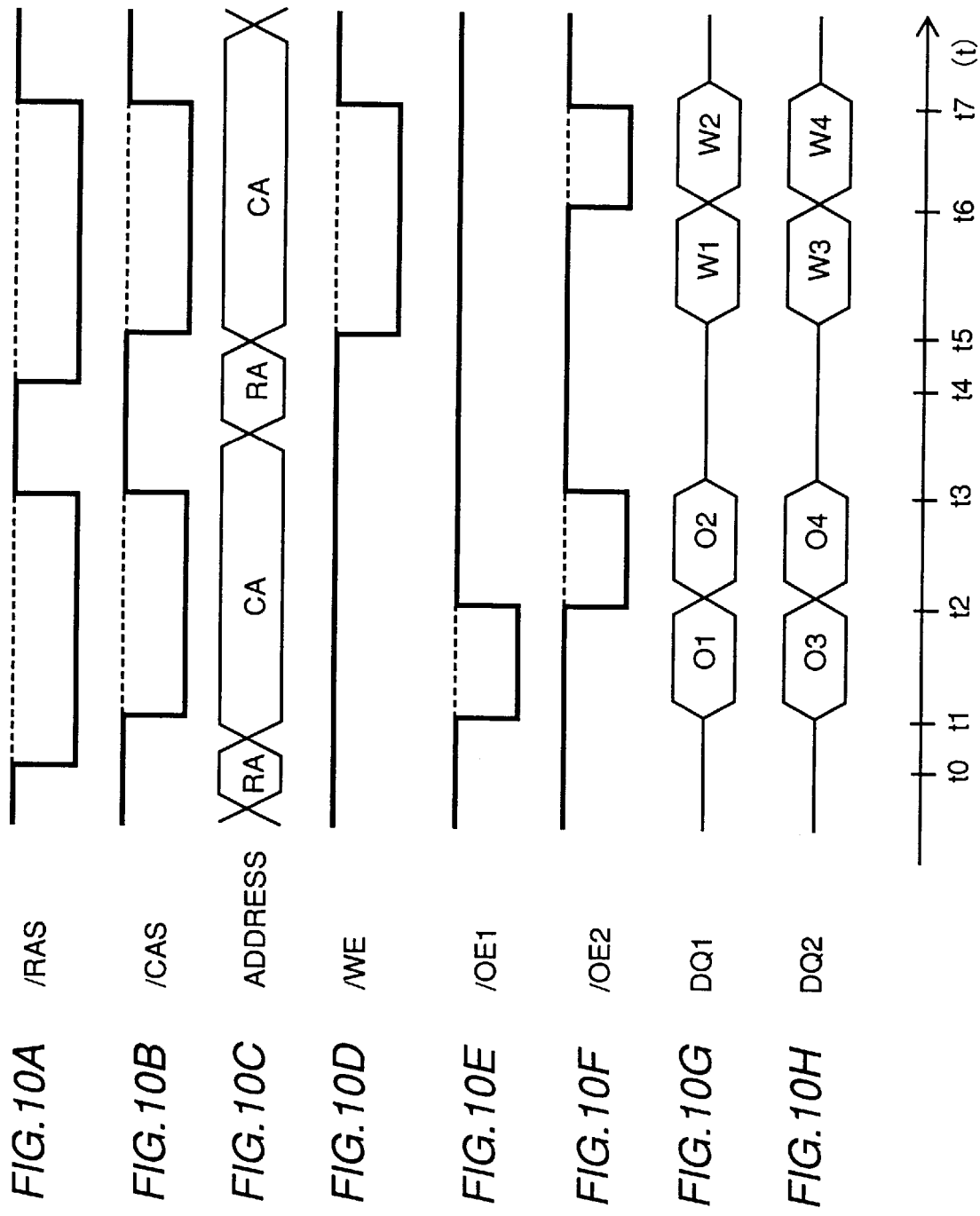
FIGS. 10A–10H are timing charts for illustrating the relationship between input and output signals of the semiconductor memory device according to a second embodiment of the present invention.

FIGS. 10A–10H are timing charts for illustrating the relationship between write and readout operations of semiconductor memory device 200 according to the second embodiment of the present invention. In FIG. 10C, RA indicates internal row address signal and CA indicates internal column address signal.

In semiconductor memory device 200, memory blocks #1 to #4 are divided into a group of memory blocks #1 and #2 and a group of memory blocks #3 and #4, input and output circuits, each commonly employed for memory blocks of each group, are provided, which input and output circuits using a common external terminal for input and output of data. Control of input and output operations for each group is performed by a third control signal C based on /RAS signal and /CAS signal which will be described later. Specifically, readout operation is performed by selecting either one of the two memory blocks within each group according to /OE1 and /OE2 signals based on this third control signal C, while write operation is performed by selecting either one of the two memory blocks within each group according to /OE2 signal.

More particularly, operation of semiconductor memory device 200 upon readout operation is as follows (when /OE1 or /OE2 is at L level). When /OE1 signal is at L level, an electric signal O1 corresponding to the written signal of memory cell MC located at address Z1 of memory block #1 is output from external terminal DQ1, and an electric signal 03 corresponding to written signal of memory cell MC located at address Z1 of memory block #3 is output from external terminal DQ2, using third control signal C produced from /RAS and /CAS signals.

Meanwhile, when /OE2 signal is at L level, an electric signal 02 corresponding to written signal of memory cell MC located at address Z1 of memory block #2 is output from external terminal DQ1, and an electric signal 04 corresponding to written signal of memory cell MC located at address Z1 of memory block #4 is output from external terminal DQ2.

In addition, operation of semiconductor memory device 200 upon write operation is as follows (when /WE signal is at L level). When /OE2 signal is at H level, input signal W1 from external terminal DQ1 is written into memory cell MC located at address Z2 of memory block #1 while input signal W3 from external terminal DQ2 is written into memory cell MC located at address Z2 of memory block #3, using third control signal C produced from /RAS and /CAS signals.

Meanwhile, when /OE2 signal is at L level, input signal W2 from external terminal DQ1 is written into memory cell MC located at address Z2 of memory block #2, and input signal W4 from external terminal DQ2 is written into memory cell MC located at address Z2 of memory block #4.

Following is a detailed description for structure and operation of semiconductor memory device 200.

Referring to FIG. 11, internal control signal generating circuit 11 additionally includes an NOR circuit NOR3. NOR circuit NOR3 receives /RAS and /CAS signals generated at internal control signal generating circuit 11 itself to output third control signal C. Next, description will now be given for the operation of internal control signal generating circuit 11.

Referring to FIGS. 12A–12C, NOR3 circuit NOR3 which receives signal at H level before time t1 outputs the signal at L level.

During the period between time t1 and time t2, NOR circuit NOR3 which receives /RAS signal at L level and /CAS signal at L level outputs a signal at H level.

After time t2, NOR circuit NOR3 which receives /CAS signal of H level outputs a signal at L level.

Accordingly, output of NOR circuit NOR3, that is, the third control signal C, would attain H level when /RAS and /CAS signals are both at L level, and would attain L level when /RAS or /CAS signal is at H level.

Specifically, upon operation of a memory of semiconductor memory device 200, internal control signal generating circuit 11 produces a third control signal C.

Figure 13:
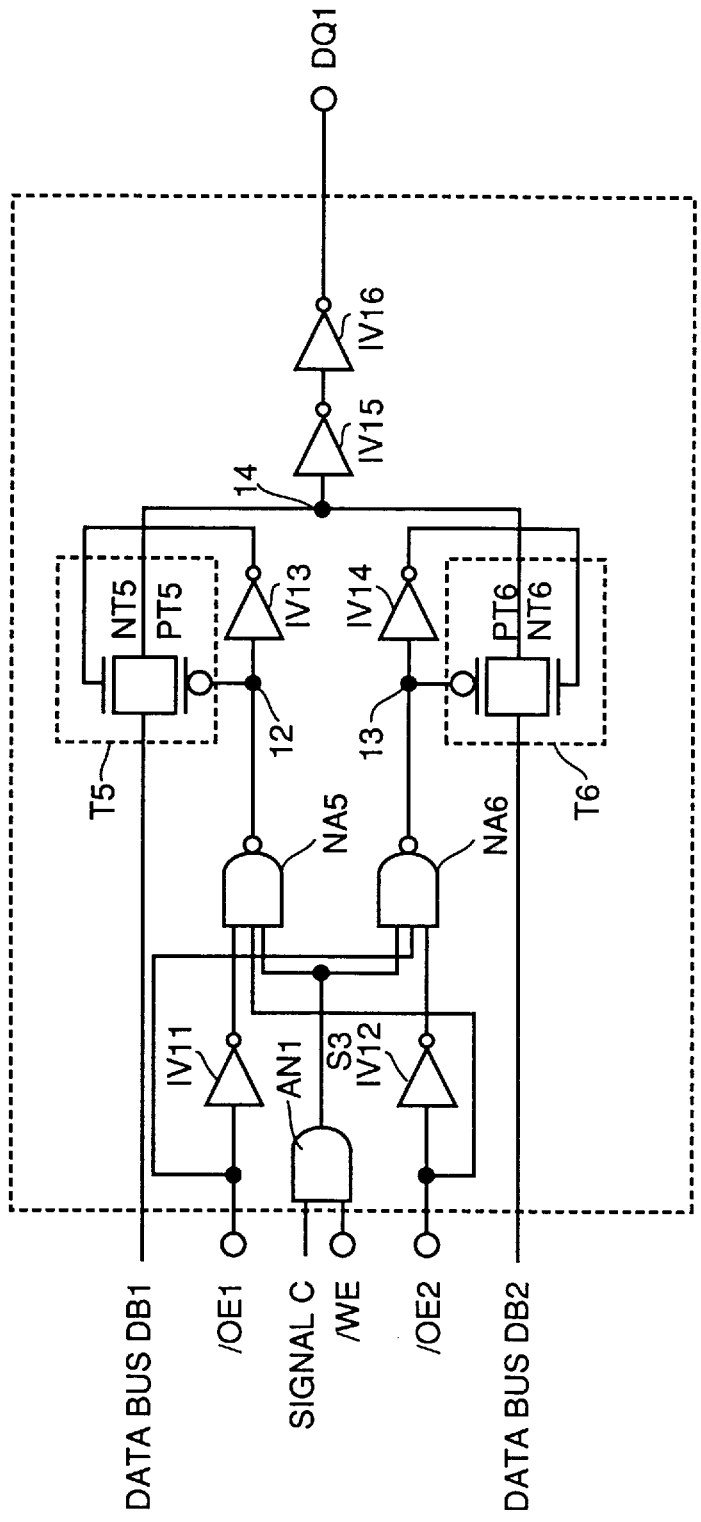
FIG. 13 is a schematic circuit diagram showing a structure of a data output buffer circuit according to the second embodiment of the present invention.

Referring to FIG. 13, data output buffer circuit 22 includes an AND circuit AN1, inverter circuits IV1 to IV16, NAND circuits NA5, NA6 and transfer gates T5, T6.

AND circuit AN1 receives /WE signal and third control signal C produced at internal control signal generating circuit 11 and outputs signal S3.

NAND circuit NA5 receives signal S3, a signal obtained by inverting /OE1 signal with inverter circuit IV11, and /OE2 signal, and outputs the result of operation to node 12.

NAND circuit NA6 receives signal S3, /OE1 signal, and a signal obtained by inverting /OE2 signal with inverter IV12, and outputs the result of operation to node 13.

Transfer gate T5 includes PMOS PT5 and NMOS NT5.

Each of PMOS PT5 and NMOS NT5 has its one conductive terminal connected at node 14, and the other conductive terminal connected to data bus DB1 of memory block #1. PMOS PT5 receives at its gate a signal on node 12 while NMOS NT5 receives at its gate an output signal of inverter circuit IV13 (inversion of the signal on node 12).

Transfer gate T6 includes PMOS PT6 and NMOS NT6.

Each of PMOS PT6 and NMOS NT6 has its one conductive terminal connected at node 14, and the other conductive terminal connected to data bus DB2 of memory block #2. PMOS PT6 receives at its gate the signal on node 13, while NMOS NT6 receives at its gate the output signal of inverter circuit IV14 (inversion of the signal on node 13).

Inverter circuit 15 is connected to node 14, receives the outputs of transfer gates T5 and T6, and inverts and amplifies the received outputs. Meanwhile, inverter circuit IV16 inverts and outputs the output of inverter circuit IV15 and outputs this to external terminal DQ1.

Data output buffer circuit 23 is of the same structure as that of data output buffer circuit 22, employing data bus DB3 instead of data bus DB1 for input line, data bus DB4 instead of data bus DB2 for input line, and external terminal DQ2 instead of external terminal DQ1 for output terminal.

Figure 14:
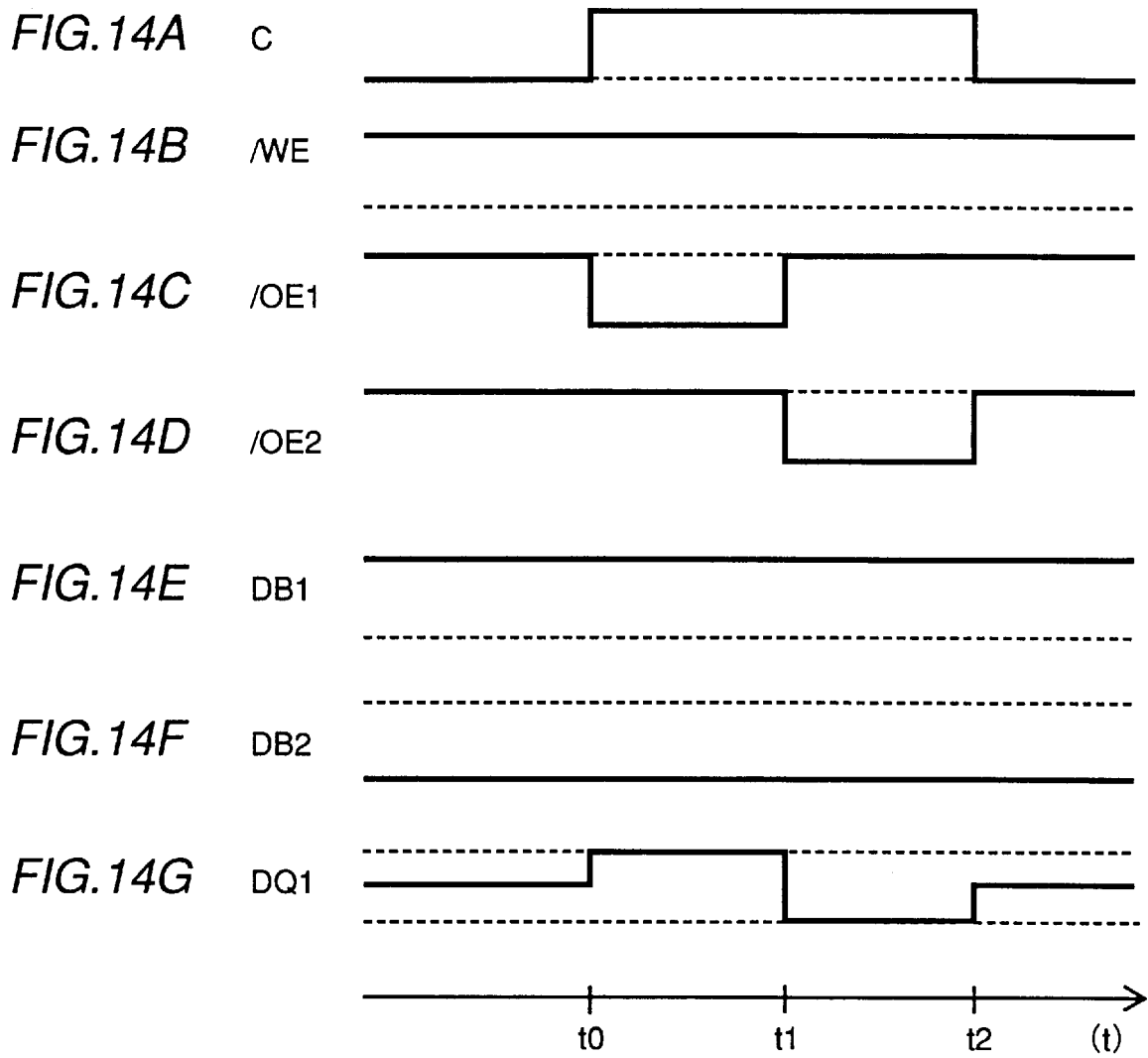
FIGS. 14A–14G are timing charts for illustrating the relationship between input and output signals of the data output buffer circuit according to the second embodiment of the present invention.

In the following, description will be given with reference to FIGS. 14A–14C for the case in which /RAS signal falls to L level, followed by fall of /CAS signal to L level thereby selecting a specific memory cell MC from each of the memory blocks #1 to #4, while /WE signal being at H level.

In addition, as has been described with reference to FIGS. 12A–12C, it is assumed that internal control signal generating circuit 11 produces third control signal C shown in FIG. 14A based on /RAS and /CAS signals.

During the period between time t0 and time t2, since /WE signal is at H level and third control signal is at H level, signal S3 output from AND circuit AN1 of FIG. 13 is at H level.

During the period between time t0 and time t1, NAND circuit NA5 receiving signal S3 at H level, a signal at H level obtained by inverting /OE1 signal at L level with inverter circuit IV11, and /OE2 signal at H level outputs a signal at L level to node 12. Transfer gate T5 receives at the gate of PMOS PT5 a signal at L level on node 12 and receives at the gate of NMOS NT5, a signal at H which is a signal level obtained by inverting the signal on node 12 with inverter circuit IV13. As a result, transfer gate T5 is rendered conductive.

Meanwhile, NAND circuit NA6 receiving signal S3 at H level, /OE1 signal at L level, a signal at L level obtained by inverting /OE2 signal at H level with inverter circuit IV12 outputs a signal at H level to node 13. Transfer gate T6 receives at the gate of PMOS PT6 the signal at H level on node 13, and receives at the gate of NMOS NT6 a signal at L level which is a signal obtained by inverting the signal on node 13 with inverter circuit IV14. As a result, transfer gate T6 is rendered non-conductive.

Accordingly, if /OE1 signal is at L level, an electric signal corresponding to the signal on data bus DB1 of memory block #1 is output from external terminal DQ1 via transfer gate T5.

During the period between time t1 and time t2, NAND circuit NA6 receiving signal S3 at H level, OE1 signal at H level, and a signal at H level obtained by inverting /OE2 signal at L level with inverter circuit IV12 outputs a signal at L level to node 13. Transfer gate T6 receives at the gate of PMOS PT6 a signal at L level on node 13, and receives at the gate of NMOS NT6 a signal at H level which is a signal obtained by inverting the signal on node 13 with inverter circuit IV14. As a result, transfer gate T6 is rendered conductive.

Meanwhile, NAND circuit NA5 receiving signal S3 at H level, a signal at L level obtained by inverting /OE1 signal at H level with inverter circuit IV11, and /OE2 signal at L level outputs a signal at H level to node 12. Transfer gate T5 receives at the gate of PMOS PT5 the signal at H level on node 12, and receives at the gate of NMOS NT5 a signal at L level which is a signal obtained by inverting the signal on node 12 with inverter circuit IV13. As a result, transfer gate T5 is rendered non-conductive.

Accordingly, if /OE2 signal is at L level, an electric signal corresponding to the signal on data bus DB2 of memory block #2 is output from external terminal DQ1 via transfer gate T6.

During the period in which /OE1 and /OE2 signals are both at H level, that is, when readout operation is not performed (before time t0 and after time t2 in FIG. 14G), signals output from inverter circuits IV11 and IV12 are both at L level, and thus NAND circuit NA 5 outputs a signal at H level to node 12 and NAND circuit NA6 outputs a signal at H level to node 13. As a result, transfer gate T5 and T6 are both rendered non-conductive. Accordingly, data bus DB1 and data bus DB2 both become electrically disconnected with external terminal DQ1.

It may be noted that operation of data output buffer circuit 23 employing data bus DB3 of memory block #3 and data bus DB4 of memory block #4 as input lines and external terminal DQ2 as output terminal is basically the same as that of data output buffer circuit 22.

Specifically, when /OE1 signal or /OE2 signal attains L level and readout operation is performed, control by third control signal C is carried out based on /RAS and /CAS signals, and in response to /OE1 and /OE2 signals, data of a specific memory cell MC of memory block #1 or #2 is output selectively from external terminal DQ1 while data of a specific memory cell MC of memory block #3 or #4 is output selectively from external terminal DQ2.

Figure 15:
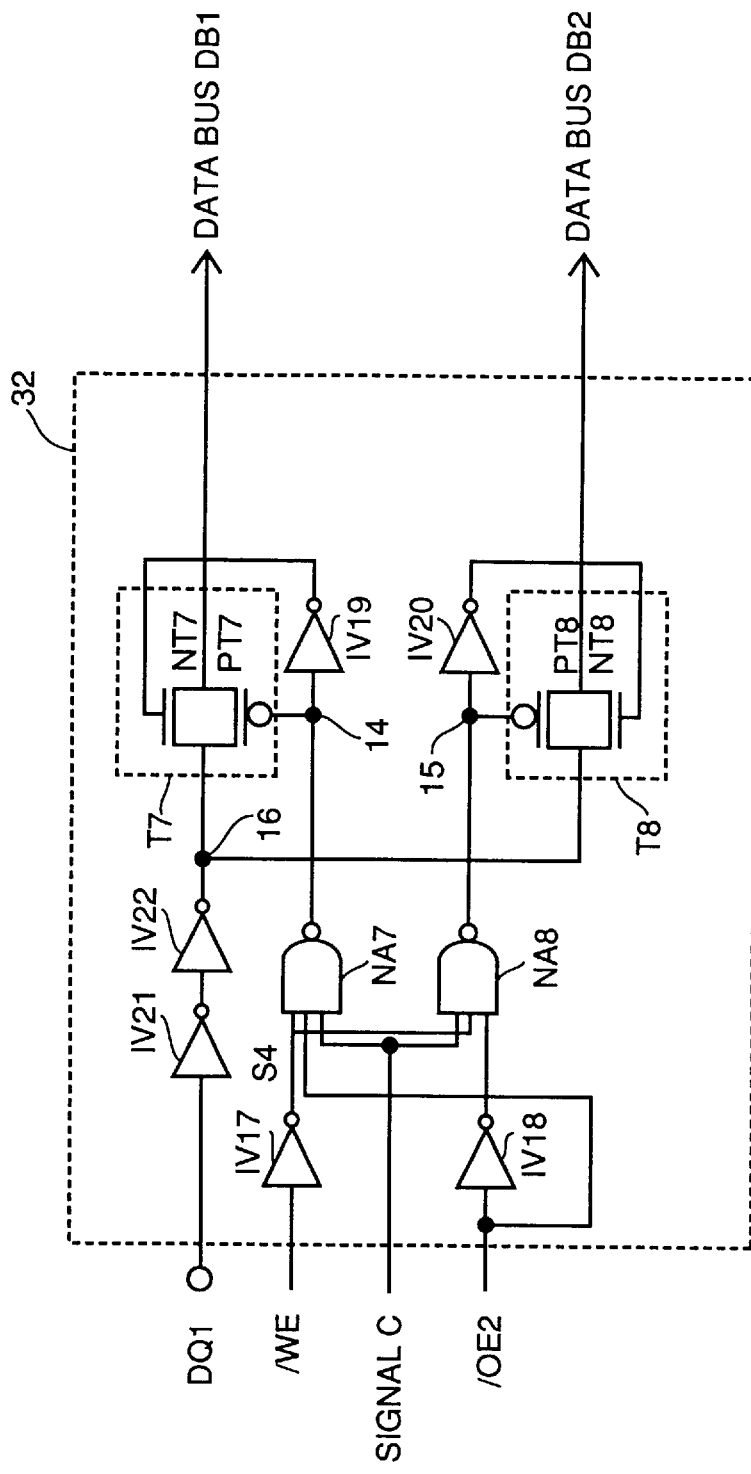
FIG. 15 is a schematic circuit diagram showing a structure of a data input buffer circuit according to the second embodiment of the present invention.

Referring to FIG. 15, data input buffer circuit 32 includes inverter circuits IV17 to IV22, NAND circuits NA7, NA8, and transfer gates T7, T8.

Inverter circuit IV7 receives /WE signal and outputs a signal S4 obtained by inverting this /WE signal.

NAND circuit NA7 receives signal S4, /OE2 signal, and third control signal C output from internal control signal generating circuit 11 and outputs the result of operation to node 14.

NAND circuit NA 8 receives signal S4, a signal obtained by inverting /OE2 signal with inverter circuit IV8, and third control signal C and outputs the result of operation to node 15.

Inverter circuit IV21 inverts and amplifies the signal received from external terminal DQ1. Meanwhile, inverter circuit IV22 further inverts and amplifies this signal and outputs this to node 16.

Transfer gate T7 includes a PMOS PT7 and an NMOS NT7.

Each of PMOS PT7 and NMOS NT7 has its one conductive terminal connected to data bus DB1 of memory block #1 and the other conductive terminal connected to node 16. PMOS PT7 receives the signal on node 14 at its gate, while NMOS NT7 receives the output signal of inverter circuit IV19 (inversion of the signal on node 14) at its gate.

Transfer gate T8 includes a PMOS PT8 and an NMOS NT8.

Each of PMOS PT8 and NMOS NT8 has its one conductive terminal connected to data bus DB2 of memory block #2 and the other conductive terminal connected to node 16. PMOS PT8 receives the signal on node 15 at its gate, while NMOS NT8 receives the output signal of inverter circuit IV20 (inversion of the signal on node 15) at its gate.

The structure of data input buffer circuit 33 is the same as that of data input buffer circuit 32, employing external terminal DQ2 instead of external terminal DQ1 for input terminal, data bus DB3 instead of data bus DB1 for output line, and data bus DB4 instead of data bus DB2 for output line.

The following description with reference to FIGS. 16A–16F is set forth on the assumption that specific memory cells MC of respective memory blocks #1 to #4 have been selected by /RAS signal falling to L level followed by /CAS signal falling to L level. In addition, as has been described already with reference to FIG. 12C, internal control signal generating circuit 11 has produced third control signal C shown in FIG. 14A.

Since /WE signal is at L level during the period between time t0 and time t2, signal S4 output by inverter circuit IV17 in FIG. 15 is at H level.

During the period between time t0 and time t1, NAND circuit NA7 receiving signal S4 at H level, third control signal C at H level and /OE2 signal at H level outputs a signal at L level to node 14. Transfer gate T7 receives at the gate of PMOS PT7 the signal at L level on node 14, and receives at the gate of NMOS NT7 a signal at H level which is a signal obtained by inverting the signal on node 14 with inverter circuit IV19. As a result, transfer gate T7 is rendered conductive.

Meanwhile, NAND circuit NA8 receiving signal S4 at H level, third control signal C at H level, and a signal at L level obtained by inverting /OE2 signal at H level with inverter circuit IV18 outputs a signal at H level to node 15. Transfer gate T8 receives at the gate of PMOS PT8 the signal at H level on node 15, and receives at the gate of NMOS NT8 a signal at L level obtained by inverting the signal on node 15 with inverter circuit IV20. As a result, transfer gate T8 is rendered non-conductive.

Accordingly, if /OE2 signal is at H level, an electrical signal corresponding to the signal input from external terminal DQ1 is conducted onto data bus DB1 of memory block #1 via transfer gate T8.

During the period between time t1 and time t2, NAND circuit NA8 receiving signal S4 at H level, third control signal C at H level, a signal at H level obtained by inverting /OE2 signal at L level with inverter circuit IV18 outputs a signal at L level to node 15. Transfer gate T8 receives at the gate of PMOS PT8 the signal at L level on node 15, and receives at the gate of NMOS NT8 a signal at H level obtained by inverting the signal on node 15 with inverter circuit IV20. As a result, transfer gate T8 is rendered conductive.

Meanwhile, NAND circuit NA7 receiving signal S4 at H level, third control signal C at H level, and /OE2 signal at L level outputs a signal at H level to node 14. Transfer gate T7 receives at the gate of PMOS PT7 the signal at H level on node 14, and receives at the gate of NMOS NT7 a signal at L level obtained by inverting the signal on node 14 with inverter circuit IV19. As a result, transfer gate T7 is rendered non-conductive.

Accordingly, if /OE2 signal is at L level, an electrical signal corresponding to the signal input from external terminal DQ1 is conducted onto data bus DB2 of memory block #2 via transfer gate T8.

During the period in which /WE signal is at H level, that is, when write operation is not performed (i.e., before time t0 and after time t2 in FIG. 16B), signal S4 output by inverter circuit IV17 is at L level, and thus NAND circuit NA7 which receives this signal then outputs a signal at H level to node 14, and NAND circuit NAB outputs a signal at H level to node 15. As a result, transfer gates T7 and T8 are both rendered non-conductive. Therefore, data bus DB1 and data bus DB2 are both electrically disconnected from external terminal DQ1.

Operation of data input buffer circuit 33 employing data bus DB3 of memory block #3 and data bus DB4 of memory block #4 as output lines and external terminal DQ2 as input terminal is basically the same as that of data input buffer circuit 32.

Specifically, when /WE signal attains L level and write operation is performed, control by third control signal C is carried out based on /RAS and /CAS signals, to selectively writes data received from external terminal DQ1 into specific memory cell MC of memory block #1 or #2 while selectively writing data received from external terminal DQ2 into specific memory cell MC of memory block #3 or #4, according to /OE2 signal.

As has been described above, in semiconductor memory device 200, memory blocks #1 to #4 are divided into two groups in which each of input and output circuits is commonly employed for memory blocks of each group and input and output circuits of each group share one common external terminal. Operation of input and output circuits are controlled by a control signal based on externally provided /RAS and /CAS signals, and in response to externally provided /OE1 and /OE2 signals, readout data can be externally output, selecting either one of the two memory blocks in a group, and in response to /OE2 signal, writing of data can be performed selecting either one of the two memory blocks in a group.

Although description has been given for four blocks with respect to the second embodiment of the present invention, the present invention is also feasible with a semiconductor device having 2K memory blocks by providing K input circuits, K output circuits, and K external terminals.

Meanwhile, it is also possible to increase the number of pins for inputting /OE signals and include two or more memory blocks in one group, one of readout data of M memory blocks being selectively output from one external terminal and input data from one external terminal being selectively written into either one of the M memory blocks.

Based on the foregoing, in accordance with the semiconductor memory device of the present invention, it is possible to operate a plurality of memory blocks without increase in chip area, even when capacity of the memory cell array is increased and the number of memory blocks included in one chip is increased.

Although the present invention has been described and illustrated in detail, it is clearly understood that the same is by way of illustration and example only and is to be taken by way of limitation, the spirit and scope of the present invention being limited only by the terms of the appended claims.

What is claimed is:

1. A semiconductor memory device comprising:
   a plurality of groups of memory blocks in which specific memory cells are selected simultaneously by a common address signal, each of said groups comprising more than one of said memory blocks, the number of said memory blocks in each group being the same;
   signal generating means responsive to a plurality of input signals respectively from a plurality of external terminals for generating a plurality of control signals;
   an output control means for each of said groups for selecting one of the blocks of the respective group according to said plurality of control signals for externally outputting readout data therefrom;
   an input control means for each of said groups for selecting one of the blocks of the respective group according to said plurality of control signals for rendering externally received input data thereto; and
   a data input/output terminal for each of said groups to be commonly employed for external data output of a respective said output control means and external data input of a respective said input control means.

2. A semiconductor memory device comprising:

a plurality of groups of memory blocks in which specific memory cells are selected simultaneously by a common address signal, each of said groups comprising more than one of said memory blocks, the number of said memory blocks in each group being the same;

signal generating means for receiving a first input signal from a first external terminal, a second input signal from a second external terminal and a third input signal from a third external terminal to generate control signals;

an output control means for each of said groups for selecting one of the blocks of the respective group according to said plurality of control signals for externally outputting readout data therefrom;

an input control means for each of said groups for selecting one of the blocks of the respective group according to said plurality of control signals for rendering externally received input data thereto; and a data input/output terminal for each of said groups to be commonly employed for external data output of a respective said output control means and external data input of a respective said input control means.

3. The semiconductor memory device according to claim 2, wherein said control signals include a first control signal and a second control signal, said output control means each includes:

means responsive to the first control signal for outputting readout data from a first memory block belonging to said corresponding group from said corresponding data input/output terminal; and means responsive to the second control signal for outputting readout data from a second memory block belonging to said corresponding group from said corresponding data input/output terminal, said input control means each includes:

means responsive to the first control signal for conducting data input from said corresponding data input/output terminal to said first memory block belonging to said corresponding group; and means responsive to the second control signal for conducting data input from said corresponding data input/output terminal to said second memory block belonging to said corresponding group.

4. The semiconductor memory device according to claim 2, wherein said first input signal is a row address strobe signal, said second input signal is a first column address strobe signal, and said third input signal is a second column address strobe signal.

5. A semiconductor memory device comprising:

a plurality of groups of memory blocks in which specific memory cells are selected simultaneously by a common address signal, each of said groups comprising more than one of said memory blocks, the number of said memory blocks in each group being the same;

signal generating means for receiving a first input signal from a first external terminal and a second input signal from a second external terminal to generate a control signal;

an output control means for each of said groups for selecting one of the blocks of the respective group in response to said control signal, a third input signal from a third external terminal and a fourth input signal from a fourth external terminal, for externally outputting readout data therefrom;

an input control means for each of said groups for selecting one of the blocks of the respective group, in response to said control signal and said fourth input signal, for rendering externally received input data thereto; and a data input/output terminal for each of said groups to be commonly employed for external data output of a respective said output control means and external data input of a respective said input control means.

6. The semiconductor memory device according to claim 5, wherein said output control means each includes:

means responsive to said control signal and said third input signal for outputting readout data from a first memory block belonging to said corresponding group from said corresponding data input/output terminal; and means responsive to said control signal and said fourth input signal for outputting readout data from a second memory block belonging to said corresponding group from said corresponding data input/output terminal, said input control means each includes:

means responsive to said control signal for conducting data input from said corresponding data input/output terminal to said first memory block when said fourth input signal is at a first logical level; and means responsive to said control signal for conducting data input from said corresponding data input/output terminal to said second memory block when said fourth input signal is at a second logical level different from the first logical level.

7. The semiconductor memory device according to claim 5, wherein said first input signal is a row address strobe signal, said second input signal is a column address strobe signal, said third input signal is a first output enable signal, and said fourth input signal is a second output enable signal.

* * * * *